United States Patent [19]

Fujioka et al.

[11] Patent Number: 5,593,800
[45] Date of Patent: Jan. 14, 1997

[54] MASK MANUFACTURING METHOD AND APPARATUS AND DEVICE MANUFACTURING METHOD USING A MASK MANUFACTURED BY THE METHOD OR APPARATUS

[75] Inventors: Hidehiko Fujioka, Yamato; Noriyuki Nose, Atsugi; Ryuichi Ebinuma, Machida; Shinichi Hara; Hiroshi Maehara, both of Yokohama, all of Japan

[73] Assignee: Canon Kabushiki Kaisha, Tokyo, Japan

[21] Appl. No.: 367,856

[22] Filed: Jan. 3, 1995

[30] Foreign Application Priority Data

| Jan. 6, 1994 | [JP] | Japan | 6-000237 |
| May 6, 1994 | [JP] | Japan | 6-094167 |
| Aug. 30, 1994 | [JP] | Japan | 6-204958 |

[51] Int. Cl.⁶ .................................................. G03F 9/00
[52] U.S. Cl. .................. 430/5; 430/397; 250/491.1; 250/492.1; 378/34; 378/35
[58] Field of Search ................ 430/5, 397; 378/34, 378/35; 250/491.1, 492.1

[56] References Cited

U.S. PATENT DOCUMENTS

| 4,969,168 | 11/1990 | Sakamoto et al. |
| 5,026,239 | 6/1991 | Chiba et al. |
| 5,063,582 | 11/1991 | Mori et al. |
| 5,093,579 | 3/1992 | Amemiya. |
| 5,112,133 | 5/1992 | Kurosawa et al. |
| 5,128,975 | 7/1992 | Iwamoto et al. |
| 5,134,436 | 7/1992 | Fujioka. |
| 5,138,643 | 8/1992 | Sakamoto. |
| 5,142,156 | 8/1992 | Ozawa et al. |
| 5,150,391 | 9/1992 | Ebinuma et al. |
| 5,155,523 | 10/1992 | Hara et al. |
| 5,182,615 | 1/1993 | Kurosawa et al. |
| 5,220,171 | 6/1993 | Hara et al. |
| 5,253,012 | 10/1993 | Chiba et al. |
| 5,262,257 | 11/1993 | Fukuda et al. |
| 5,285,488 | 2/1994 | Watanabe et al. |
| 5,323,440 | 6/1994 | Hara et al. |
| 5,347,561 | 9/1994 | Ebinuma. |
| 5,375,157 | 12/1994 | Maehara. |
| 5,377,251 | 12/1994 | Mizusawa et al. |

FOREIGN PATENT DOCUMENTS

| 3-44915 | 2/1991 | Japan. |
| 5-82421 | 4/1993 | Japan. |

*Primary Examiner*—S. Rosasco
*Attorney, Agent, or Firm*—Fitzpatrick, Cella, Harper & Scinto

[57] ABSTRACT

A mask manufacturing method includes holding through a first stage a master reticle having a pattern, holding through a second stage a mask substrate, projecting an exposure beam to the pattern of the master reticle held by the first stage, and projecting the pattern onto the mask substrate held by the second stage at a predetermined reduction magnification, and scanning the first and second stages in a timed relation and at a predetermined speed ratio, whereby the pattern of the master reticle is transferred to the mask substrate.

16 Claims, 20 Drawing Sheets

MASK MANUFACTURING METHOD AND APPARATUS AND DEVICE MANUFACTURING METHOD USING A MASK MANUFACTURED BY THE METHOD OR APPARATUS

FIELD OF THE INVENTION AND RELATED ART

This invention relates to the manufacture of a mask suitably usable in an X-ray exposure apparatus, for example, which uses synchrotron radiation light.

Exposure apparatuses for the manufacture of 64 MDRAM chips of 0.4 micron minimum linewidth may employ a combination of a conventional i-line light stepper with a phase shift method or with a modified illumination method, or a stepper which uses a shorter wavelength KrF or ArF excimer laser in place of an i-line light source for enhanced resolution.

For exposure apparatuses for the manufacture of next generation 256 MDRAM chips, however, X-ray exposure apparatus using extraordinarily shorter wavelength X-rays, are considered as effective machines because of the limitation of the resolution as determined by the wavelength and lens N.A.

FIG. 26 is a schematic view of an X-ray lithographic system which uses high luminance and high directivity synchrotron radiation light. As illustrated, there are a SOR light source 401 which provides a sheet-like beam being divergent horizontally, and an X-ray mask 402. Disposed between the light source and the X-ray mask is a mirror 405 having a reflection surface of convex shape. This mirror serves to expand the sheet-like beam X-rays 404 from the SOR light source 401 in the vertical direction, such that the X-ray beam 404 illuminates an exposure region as a whole at once. By this arrangement, a pattern of the X-ray mask 402 is transferred to a wafer 403, having been aligned with the mask. The X-ray mask 402 and the wafer 403 are supported in substantially upstanding positions by a mask chuck and a wafer chuck (both not shown). As regards the attracting and holding method, the mask chuck may employ a vacuum attraction method or an electromagnetic attraction method, while the wafer chuck may employ a vacuum attraction method or an electrostatic attraction method.

As best seen in FIGS. 27 and 28, the X-ray mask 402 comprises a mask substrate 502 (602) having a mask pattern 501 (601) of Si crystal and a supporting frame 503 (603) adhered to the supporting frame for supporting the same. Due to the weight of itself, the X-ray mask 402 contacts two or three positioning pins 504 (604), depicted by broken lines, whereby it is positioned at a predetermined position in the X-ray exposure apparatus.

There are some technical problems which should be solved to practically use such X-ray lithographic system, and one of them relates to the manufacture of X-ray masks. A stable supply of X-ray masks is required, but it is not yet realized.

For the manufacture of X-ray masks, extraordinarily high precision is required with respect to the pattern linewidth and positioning accuracy. In consideration of this requirement, an electron beam (EB) exposure method has been used for the patterning. In this method, a substrate (X-ray mask) is supported and positioned horizontally to be opposed to the floor, and in this state the substrate is patterned. With this EB method, however, there arise problems such as follows:

(1) In an X-ray exposure apparatus using synchrotron radiation light such as shown in FIG. 26, an X-ray mask and a wafer are positioned and held substantially vertically (upstanding position), and in this state the exposure process is effected. On the other hand, in an electron beam exposure apparatus for manufacturing such X-ray masks, the mask manufacturing process (patterning process) is carried out while positioning and holding each substrate horizontally. This difference in position mounted between in use of a mask (X-ray exposure process) and in manufacture of the same (patterning process), creates a problem of distortion due to the weight of the X-ray mask itself during the X-ray exposure process, which problem is not caused during the patterning process. Namely, with respect to the exposure region, there is produced a difference in positional precision between a longitudinal direction and a transverse direction, and this creates the possibility of deterioration of pattern transfer precision in use of the mask.

(2) The patterning process through an electron beam (EB) exposure apparatus involves a problem of scattering of the electron beam or a problem a closing effect correction for charging up. Also, thermal distortion due to a local temperature rise at the time of start of patterning process and at the time of the end of the patterning process, may adversely affect the pattern precision, and there is a possibility that a single mask has changing pattern precision at different positions in that mask.

These two problems are those to be solved by the present invention. Additionally, however, there is a more fundamental problem. That is, it is desired to establish a mask manufacturing technique which assures sufficient resolution on one hand and which meets the requirements of mass production on the other hand. For example, it takes several tens of minutes or several hours to perform patterning of a circuit pattern of a degree of integration equivalent to that of a 256 MDRAM chip with an electron beam. Therefore, it needs quite a lot of time for the manufacture of a large number of X-ray masks by using an electron beam patterning apparatus. Furthermore, in the near future, the production of X-ray masks having a wider exposure size such as 30 mm or 35 mm, for example, will become necessary.

SUMMARY OF THE INVENTION

It is accordingly an object of the present invention to provide an improved mask manufacturing method or an improved mask manufacturing apparatus by which enhanced X-ray mask positional precision or pattern precision is practically assured and which meets the requirement of practical mass production of X-ray masks.

It is another object of the present invention to provide an improved mask manufacturing method or an improved mask manufacturing apparatus by which the exposure area of a mask can be enlarged while assuring high precision, high resolution, and low cost.

These and other objects, features and advantages of the present invention will become more apparent upon a consideration of the following description of the preferred embodiments of the present invention taken in conjunction with the accompanying drawings.

3

Figure 2:
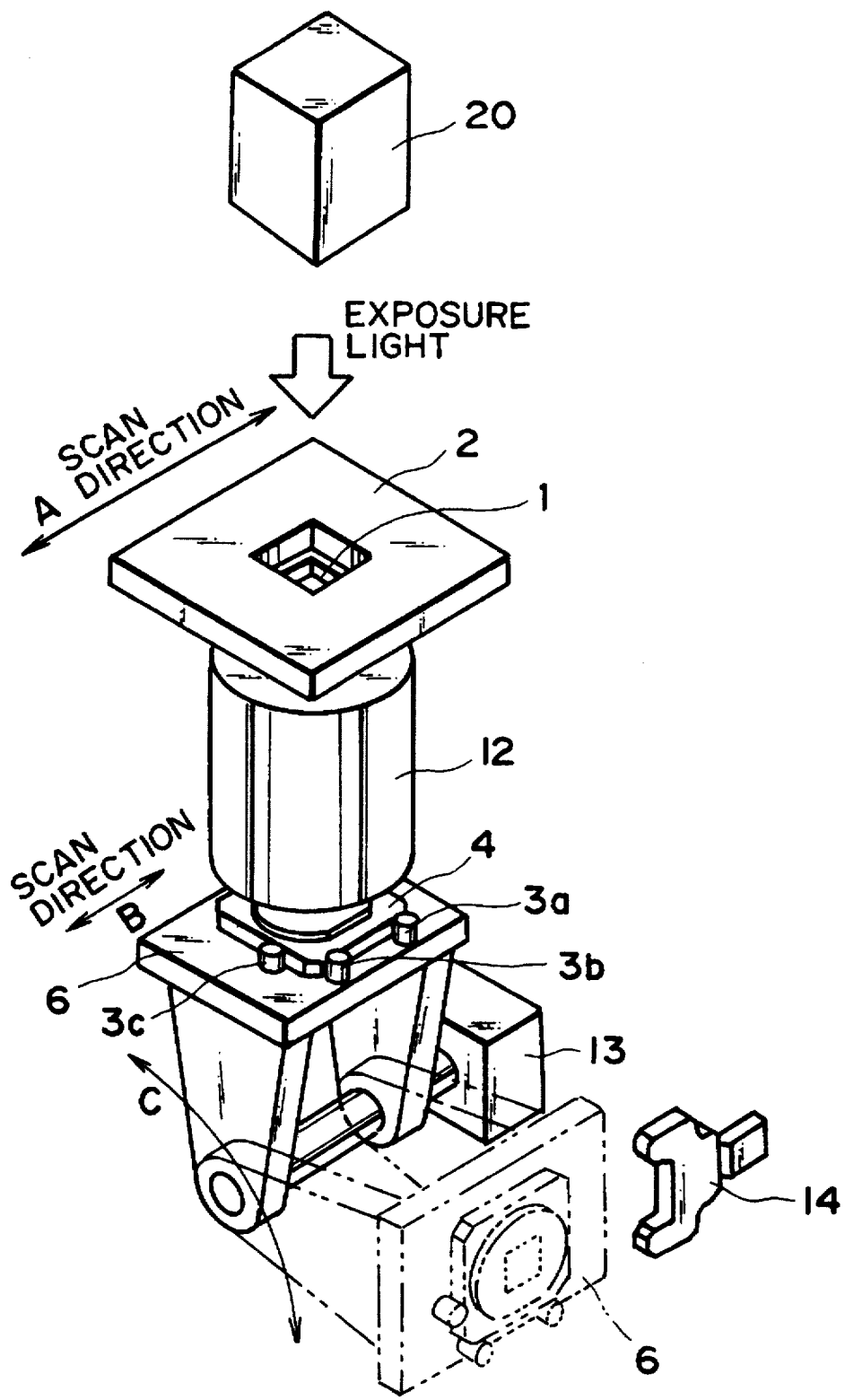

FIG. 2 is a perspective view of a mask manufacturing apparatus according to a second embodiment of the present invention.

Figure 3:
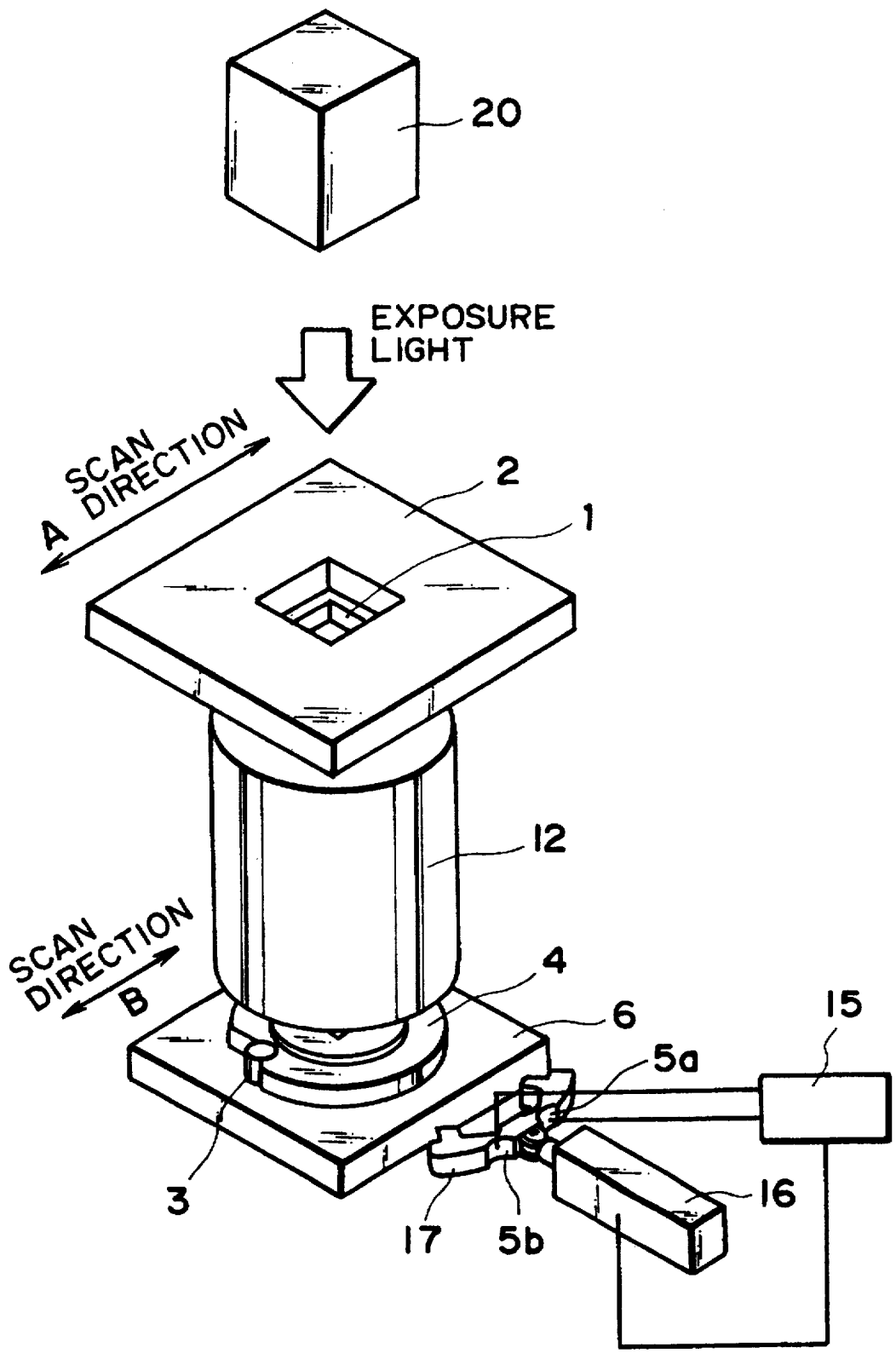

FIG. 3 is a perspective view of a mask manufacturing apparatus according to a third embodiment of the present invention.

Figure 4:
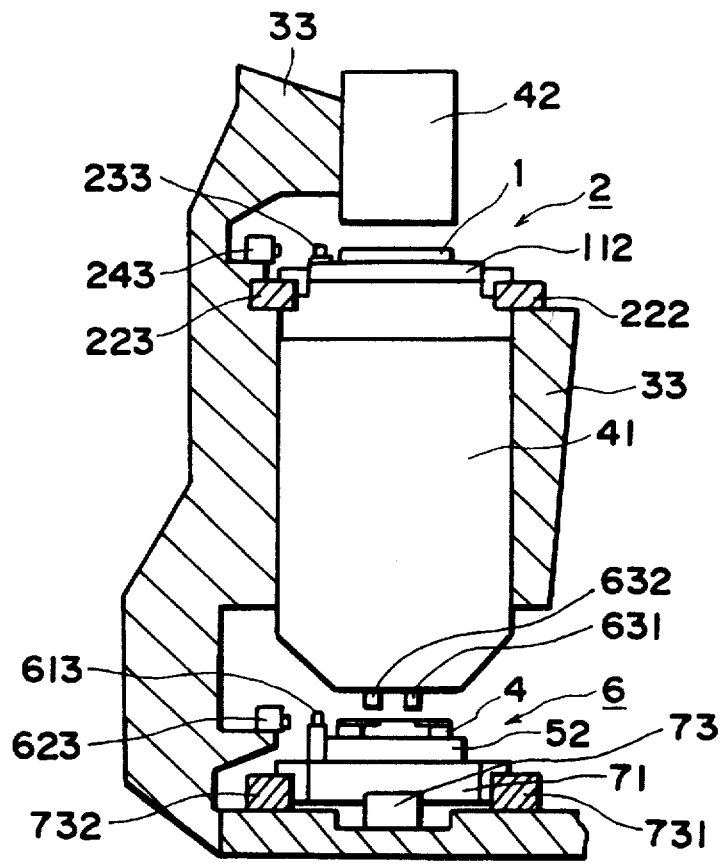

FIG. 4 is a sectional view of the mask manufacturing apparatus according to the third embodiment of the present invention.

Figure 5:
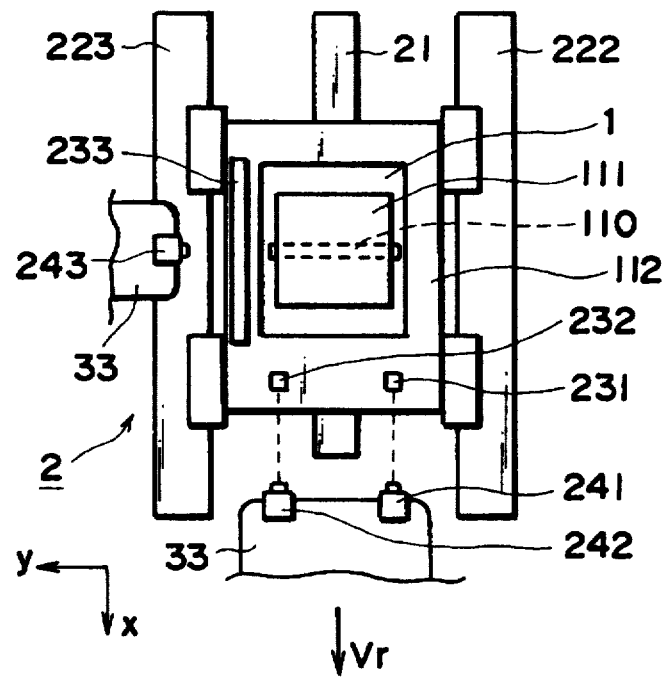

FIG. 5 is a plan view of a reticle stage of FIG. 4.

Figure 6:
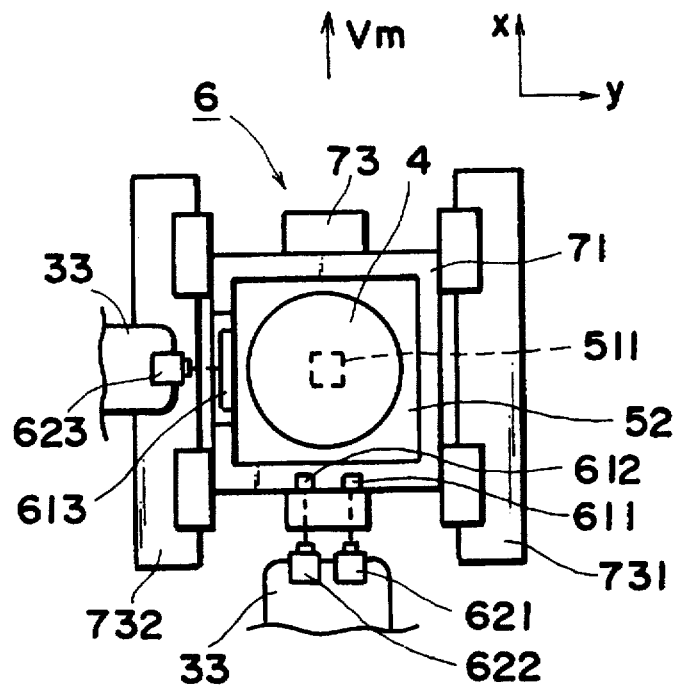

FIG. 6 is a plan view of a mask substrate stage of FIG. 4.

Figure 7:
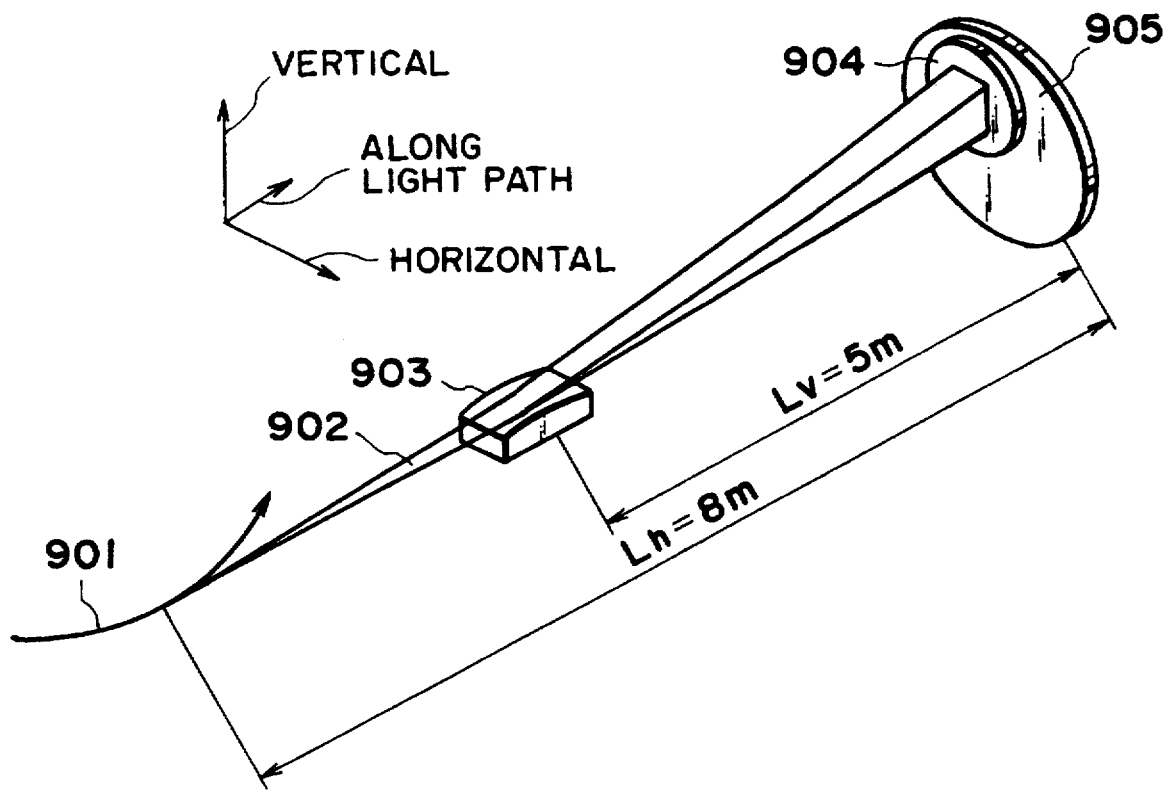

FIG. 7 is a schematic view of a lithographic system using synchrotron radiation light.

Figure 8:
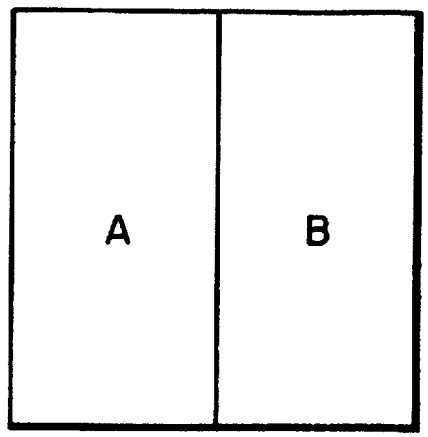

FIG. 8 is a schematic view of an example of layout of a mask pattern comprising two patterns.

Figure 9:
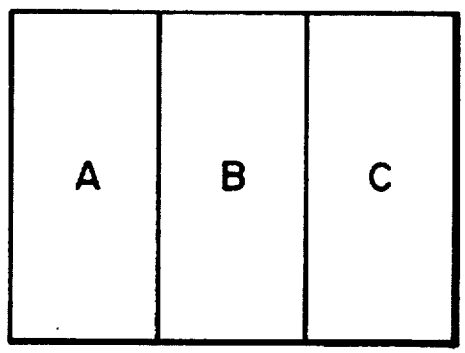

FIG. 9 is a schematic view of an example of layout of a mask pattern comprising three patterns.

Figure 10:
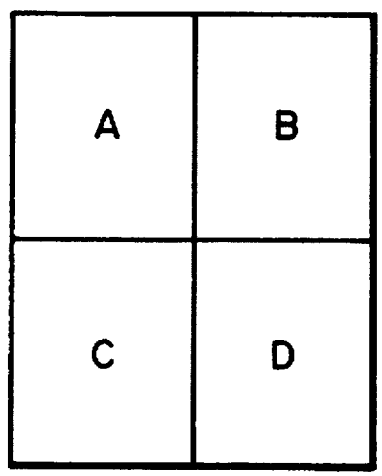

FIG. 10 is a schematic view of an example of layout of a mask pattern comprising four patterns.

Figure 11:
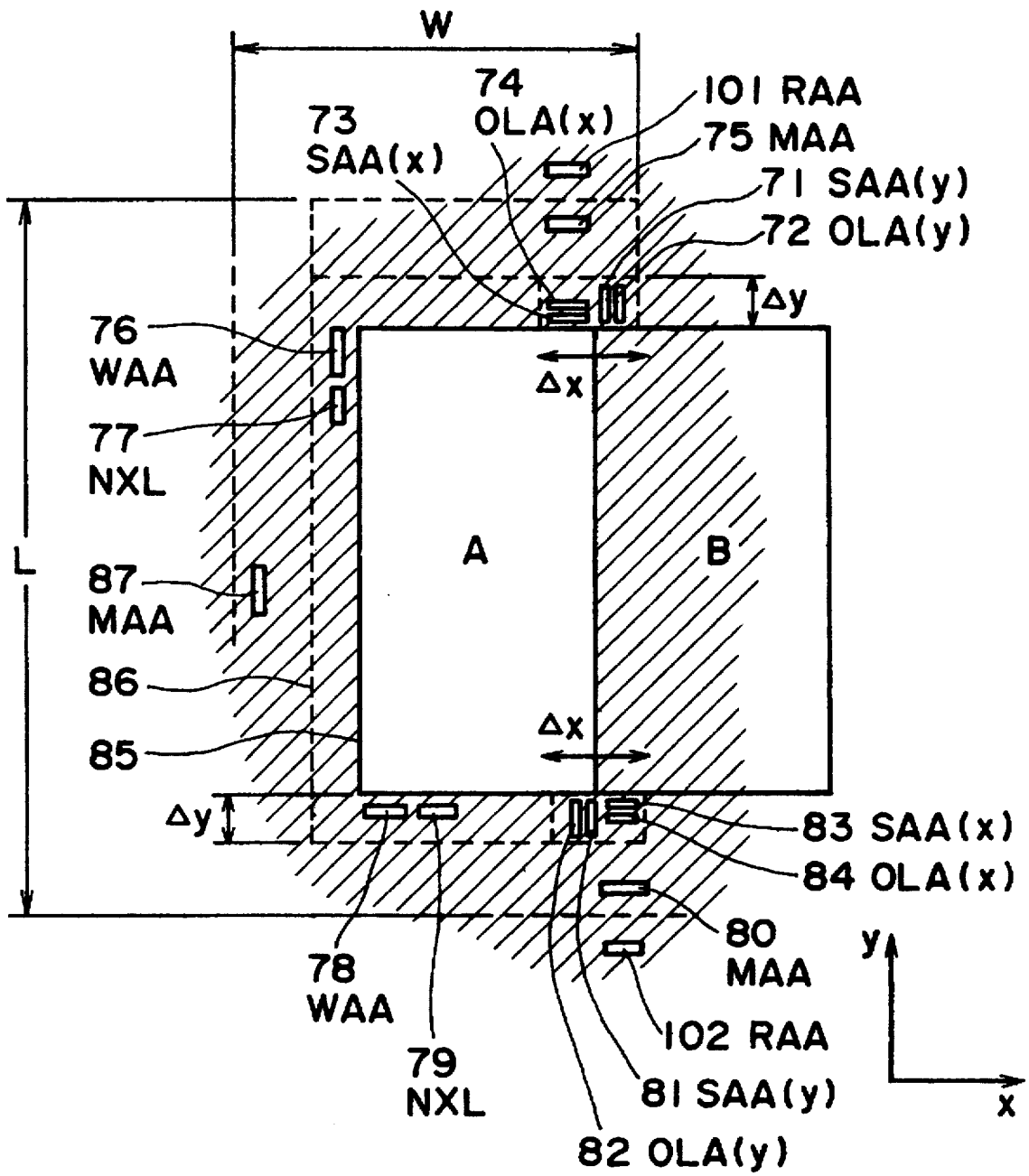

FIG. 11 is a schematic view for explaining the printing process for a pattern A.

Figure 12:
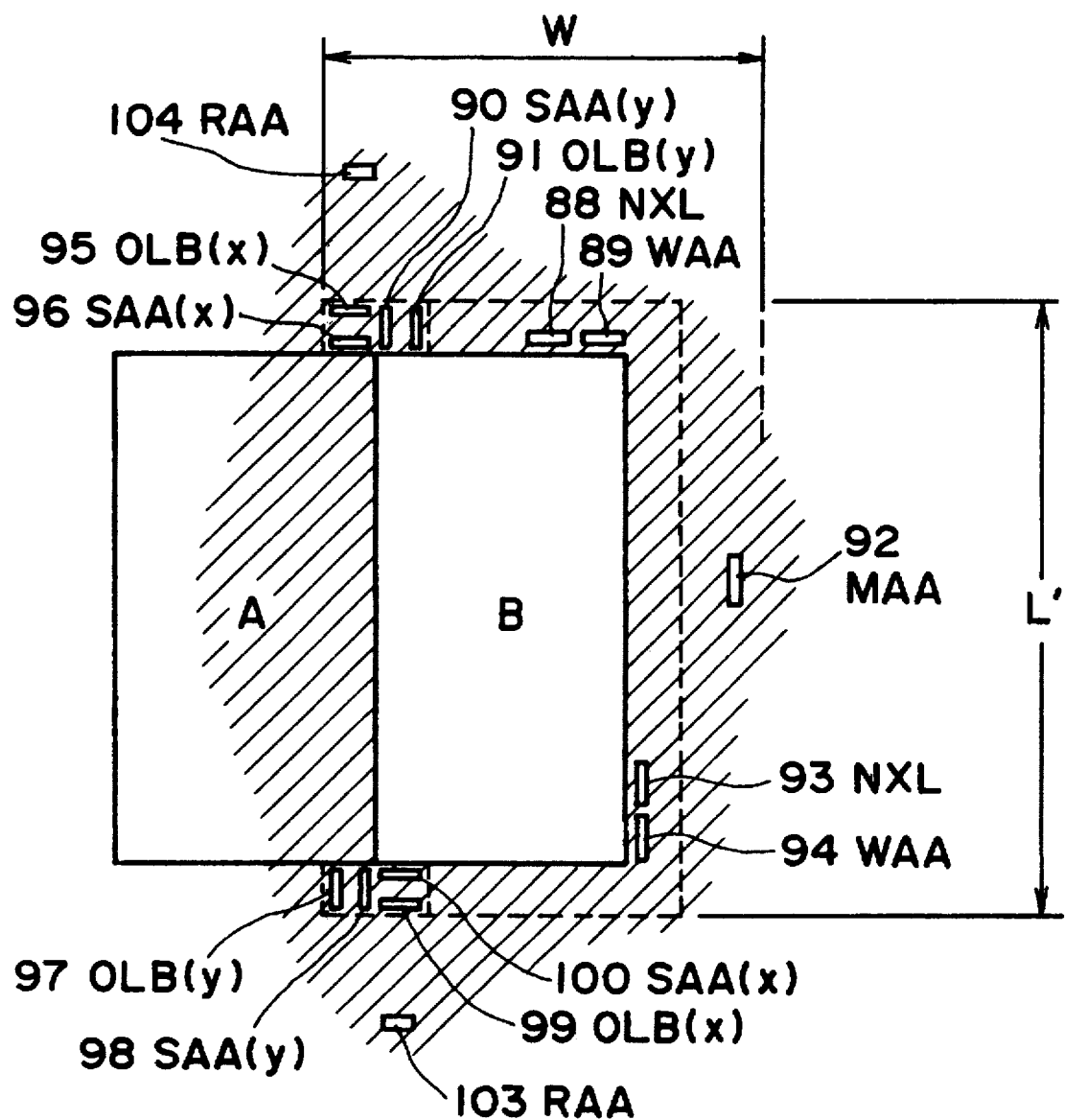

FIG. 12 is a schematic view for explaining the printing process for a pattern B.

Figure 13:
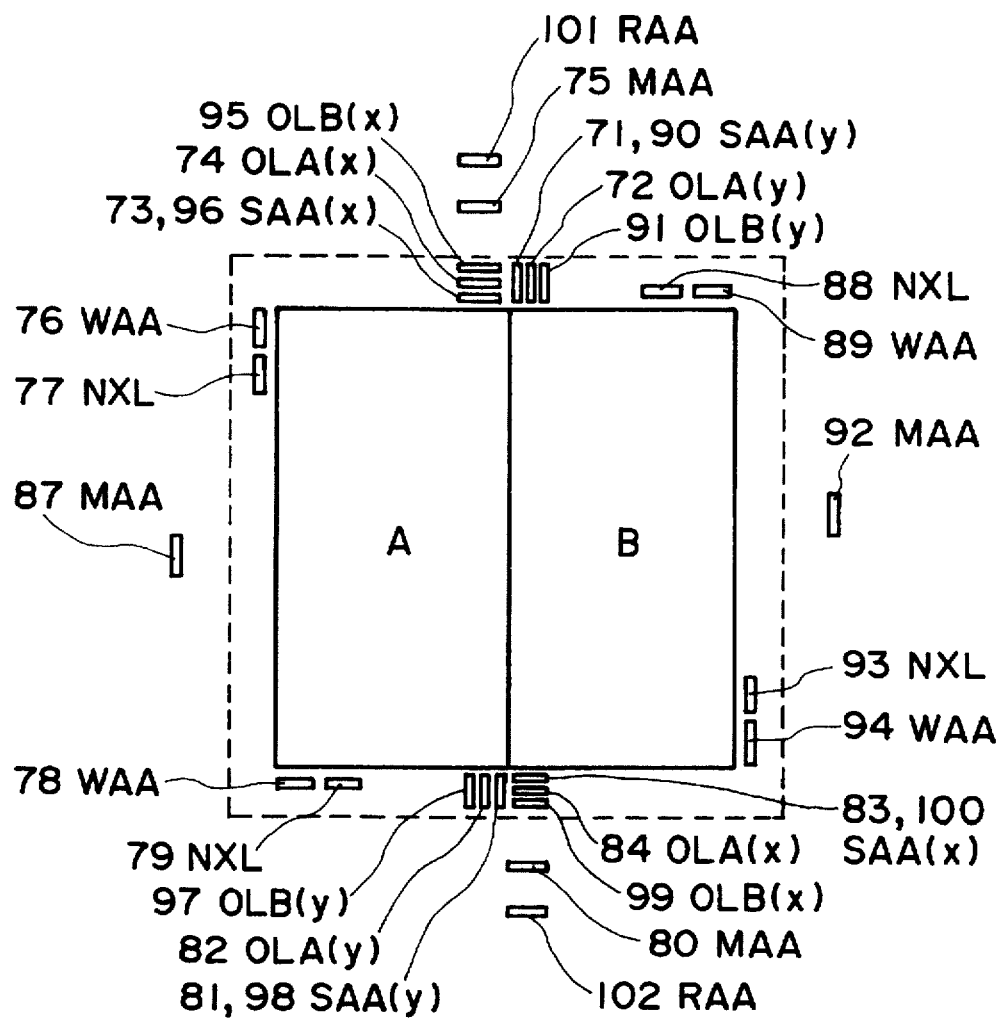

FIG. 13 is a schematic view for explaining the layout of the patterns A and B as printed.

Figure 14:
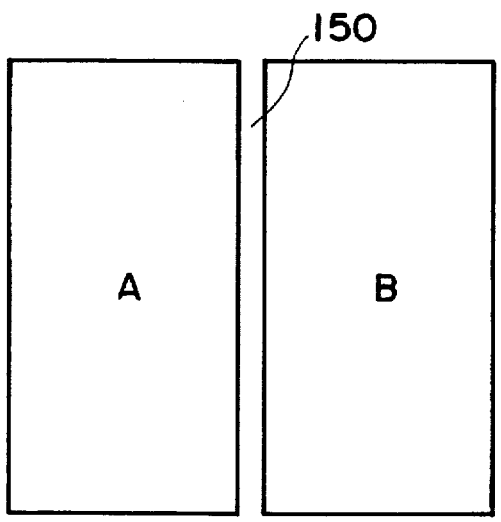

FIG. 14 is a schematic view of an example of layout of a mask pattern having two patterns and a scribe line defined between the patterns.

Figure 15:
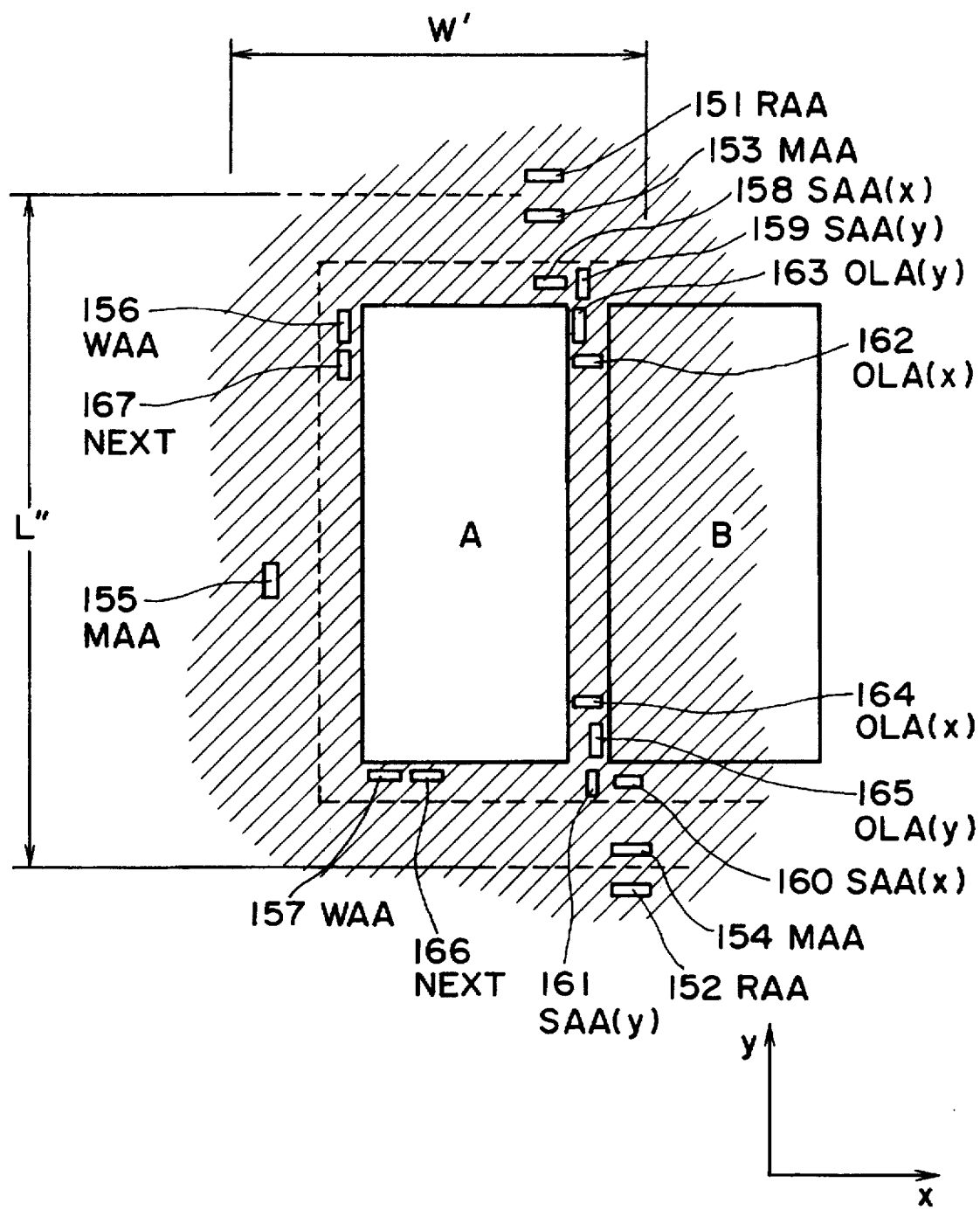

FIG. 15 is a schematic view for explaining the printing process for a pattern A.

Figure 16:
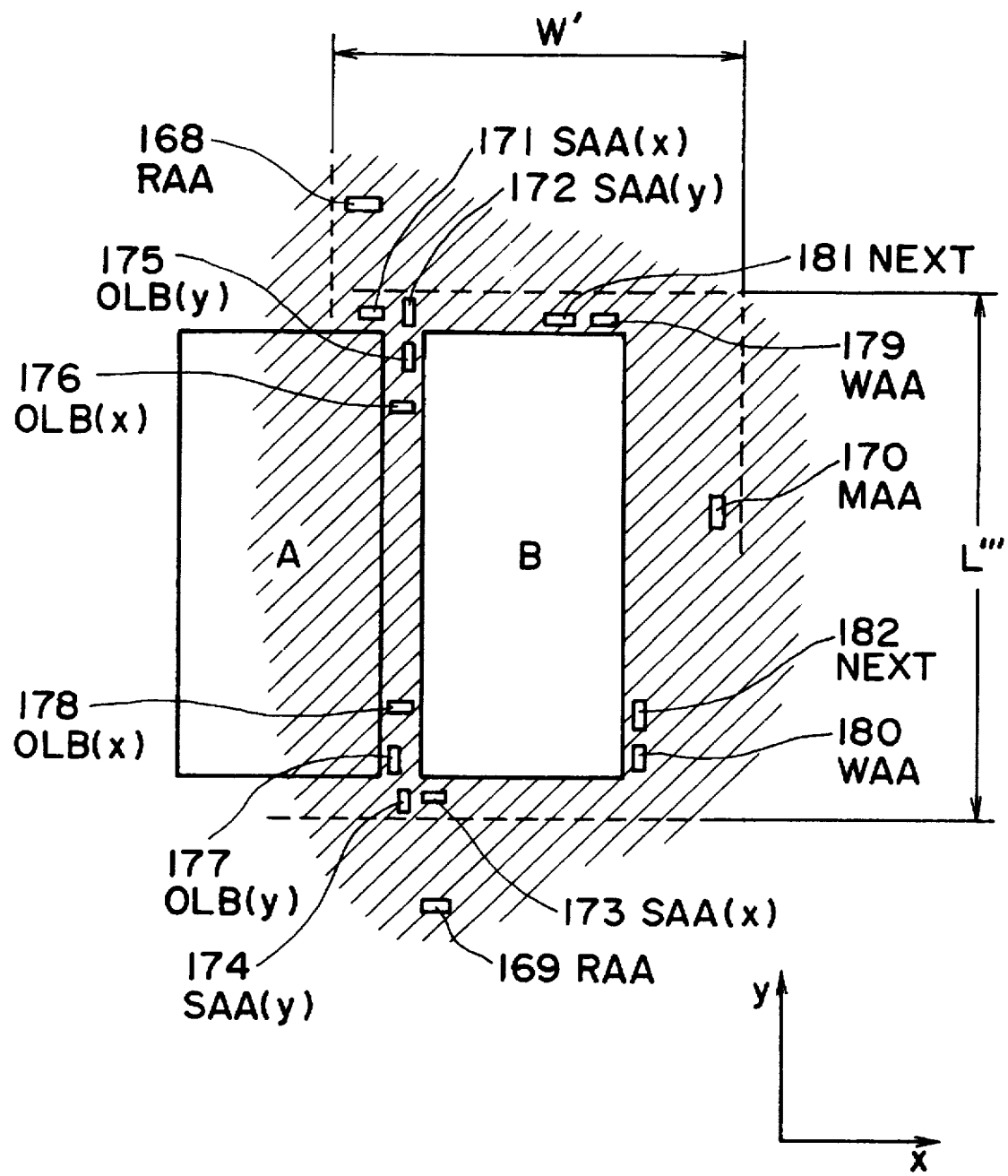

FIG. 16 is a schematic view for explaining the printing process for a pattern B.

Figure 17:
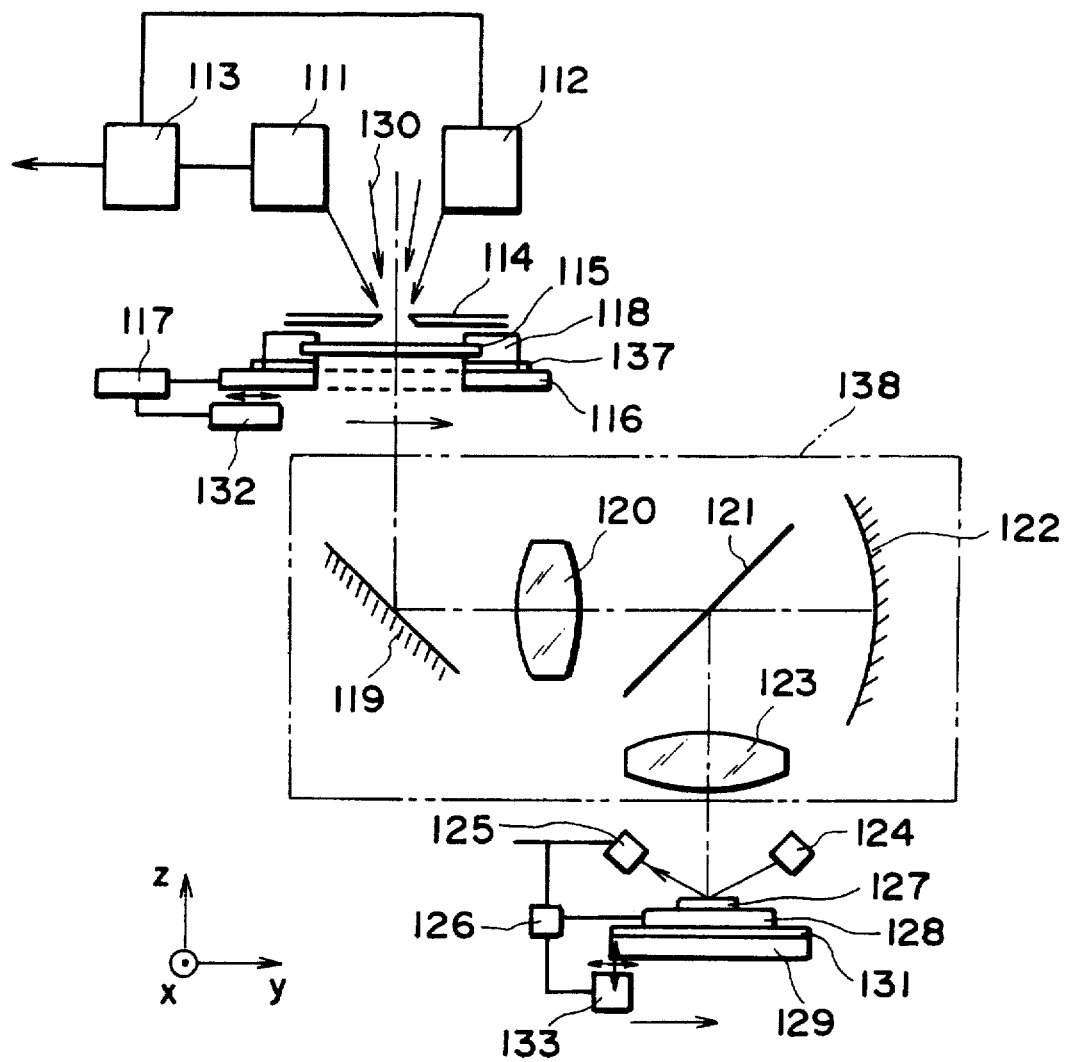

FIG. 17 is a schematic view of a scan exposure apparatus for mask manufacture, according to an embodiment of the present invention.

Figure 18:
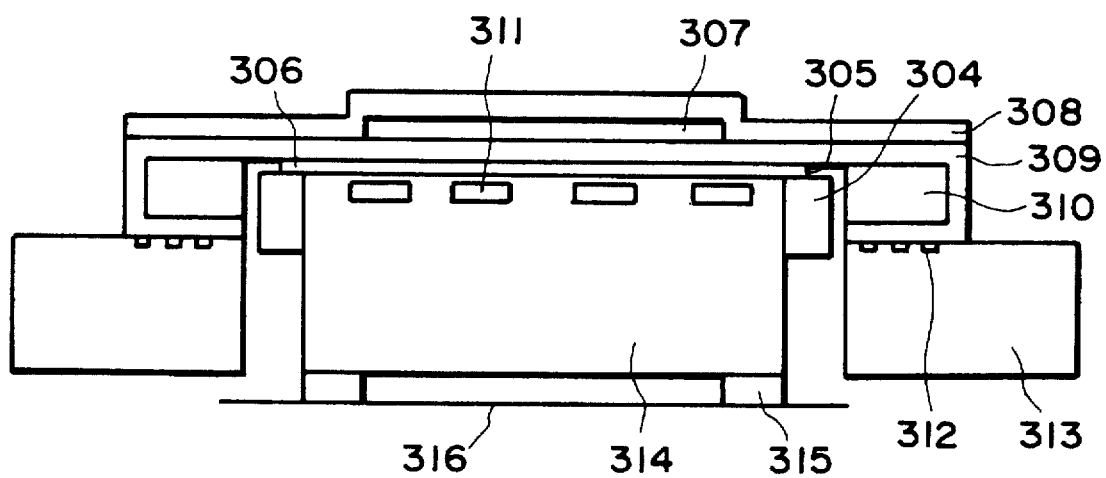

FIG. 18 is a side view of an X-ray mask manufacturing apparatus according to another embodiment of the present invention.

Figure 19:
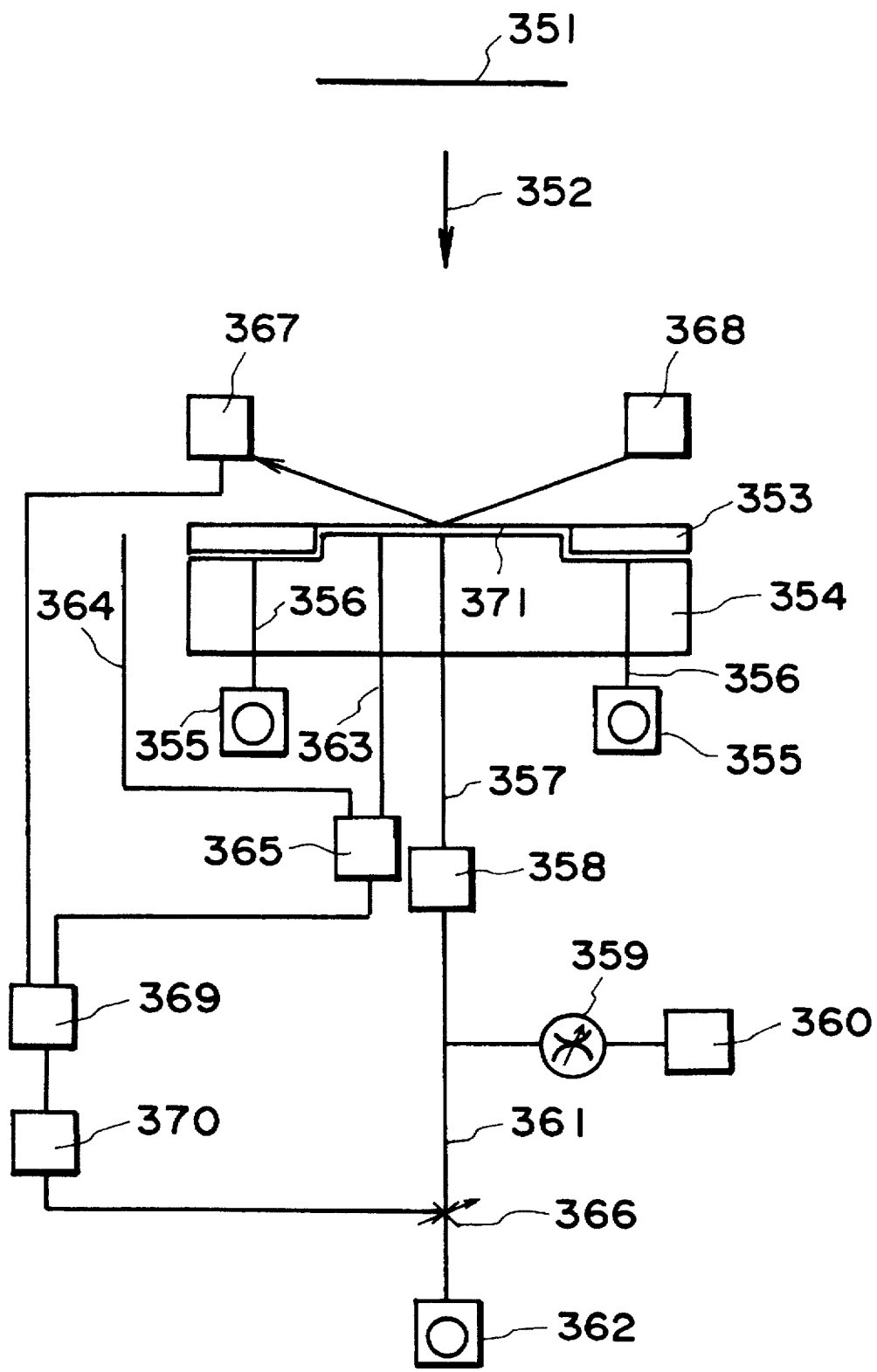

FIG. 19 is a schematic view of an X-ray mask manufacturing apparatus according to a further embodiment of the present invention.

Figure 20:
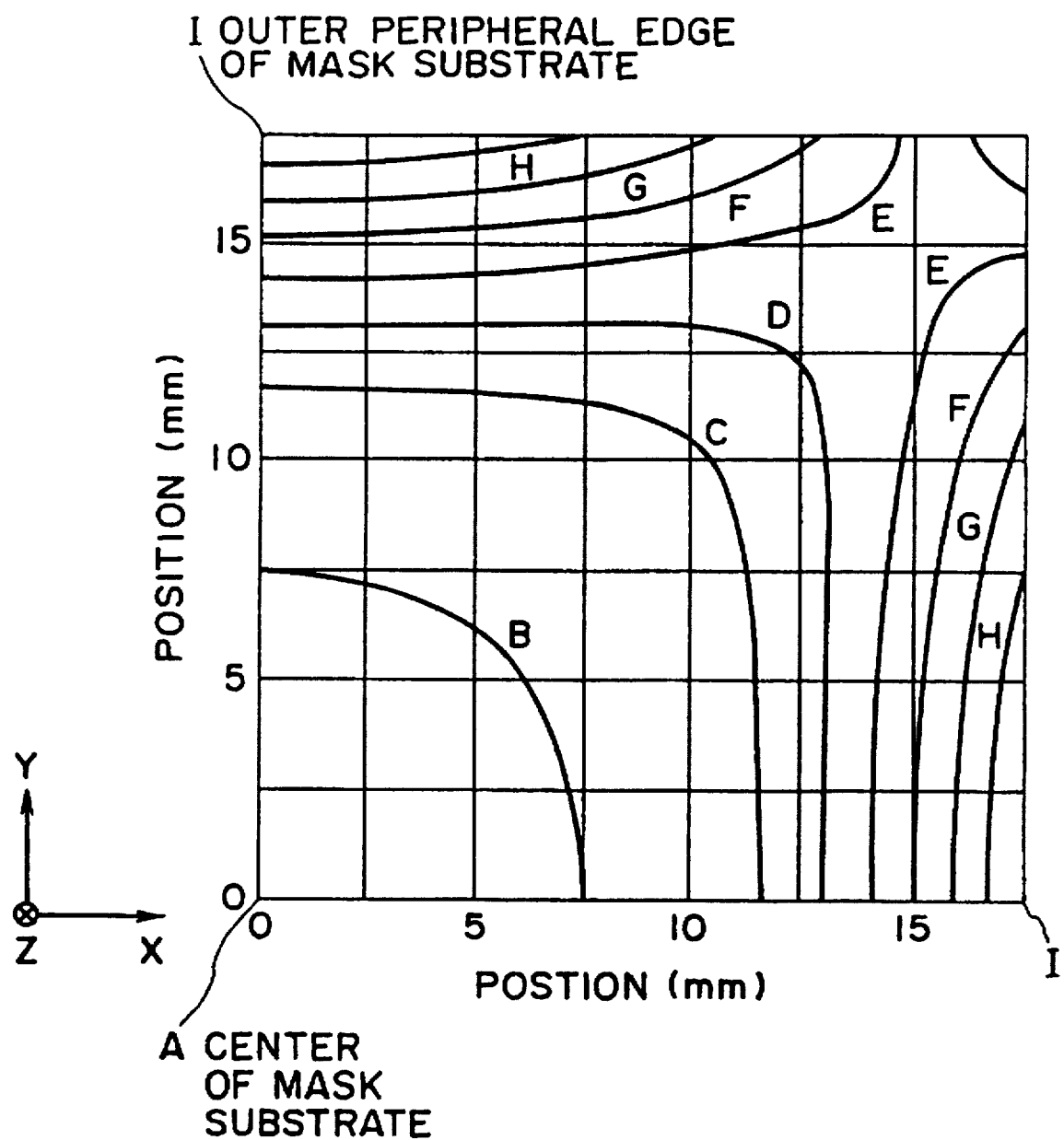

FIG. 20 is a contour chart for explaining the amount of deformation of a thin film in the embodiment of FIG. 19.

Figure 21:
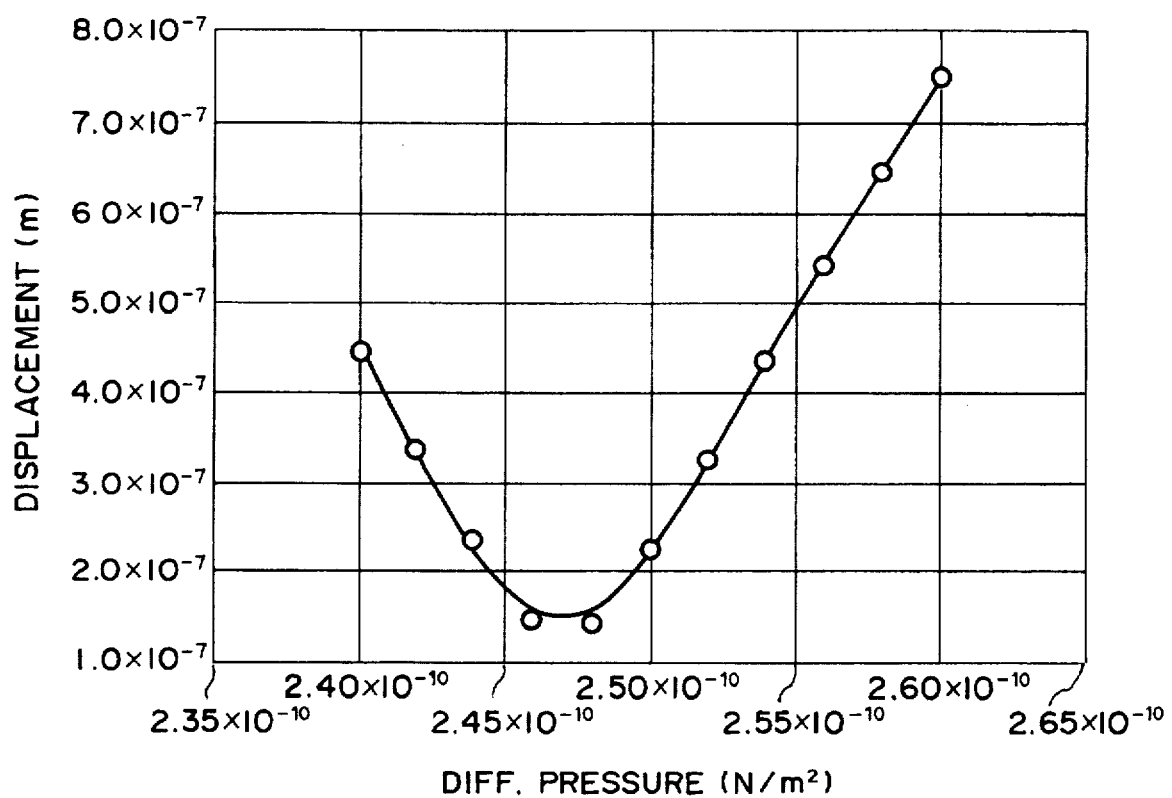

FIG. 21 is a graph for explaining the relationship between differential pressure and deformation of the thin film, in the embodiment of FIG. 19.

Figure 22:
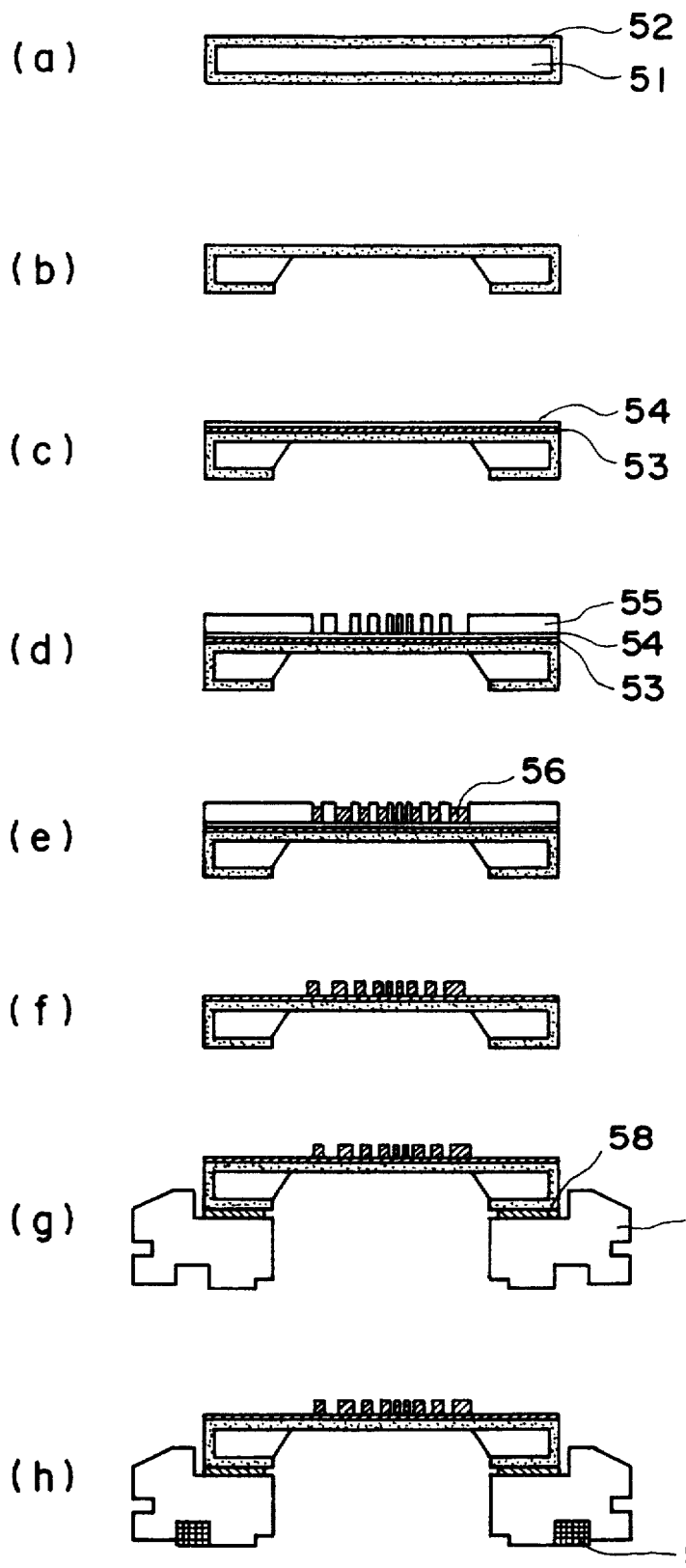

FIG. 22 is a schematic view for explaining an example of X-ray mask structure manufacturing process.

Figure 23:
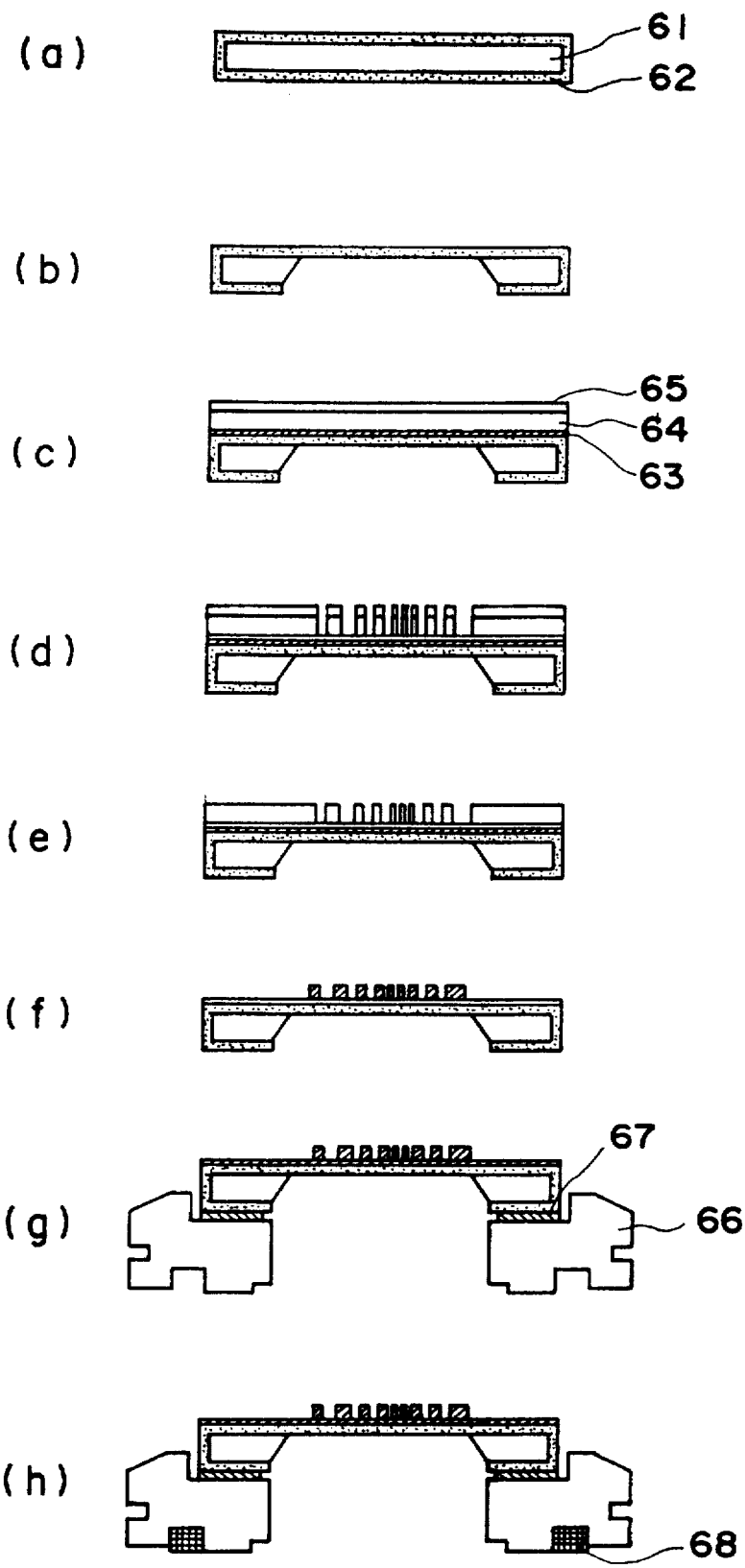

FIG. 23 is a schematic view for explaining another example of X-ray mask structure manufacturing process.

Figure 24:
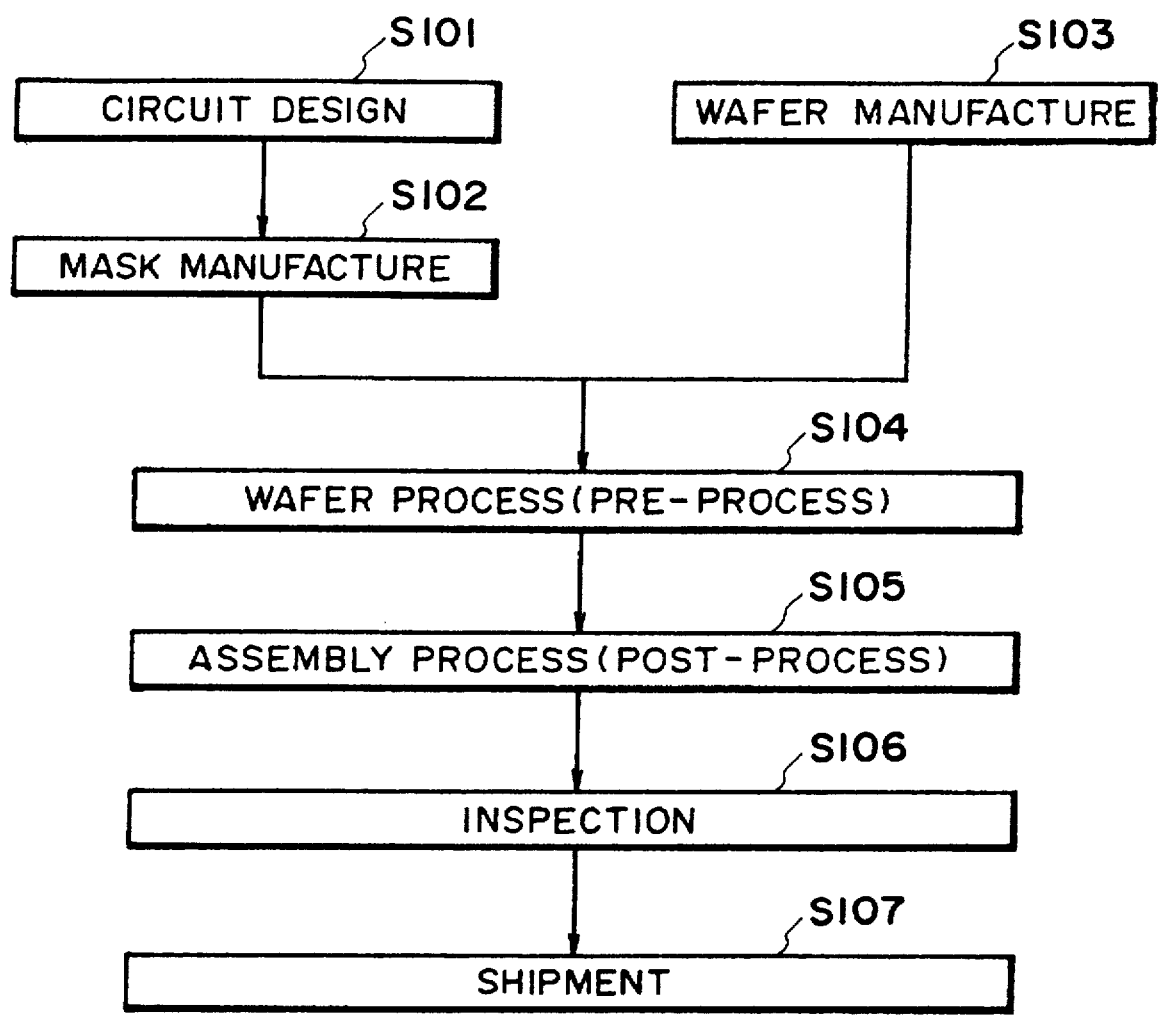

FIG. 24 is a flow chart of semiconductor device manufacturing processes.

Figure 25:
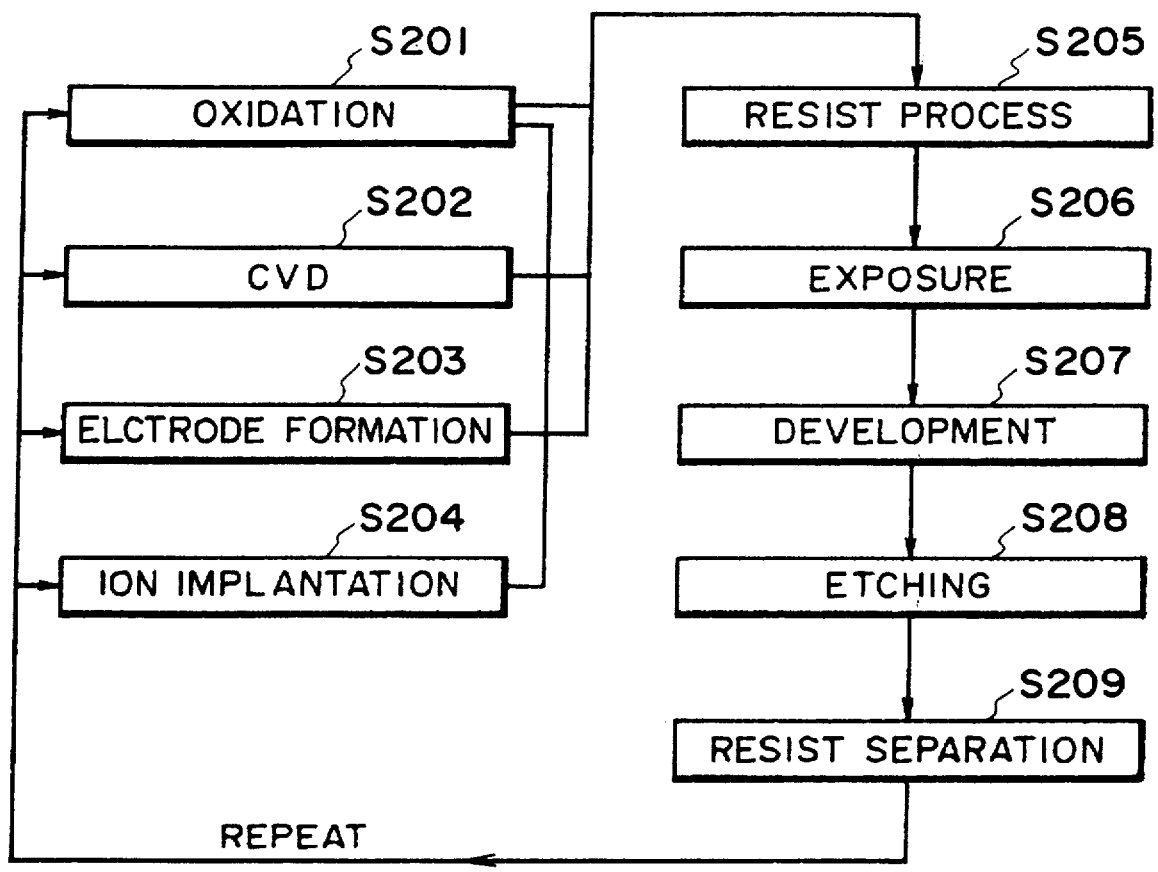

FIG. 25 is a flow chart of a wafer process.

Figure 26:
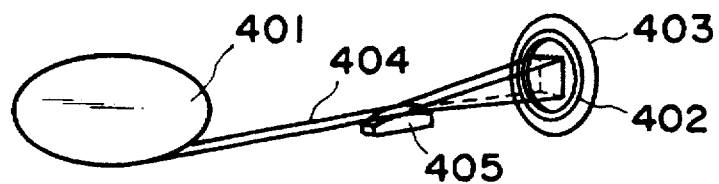

FIG. 26 is a schematic view of a lithographic system using synchrotron radiation light.

Figure 27:
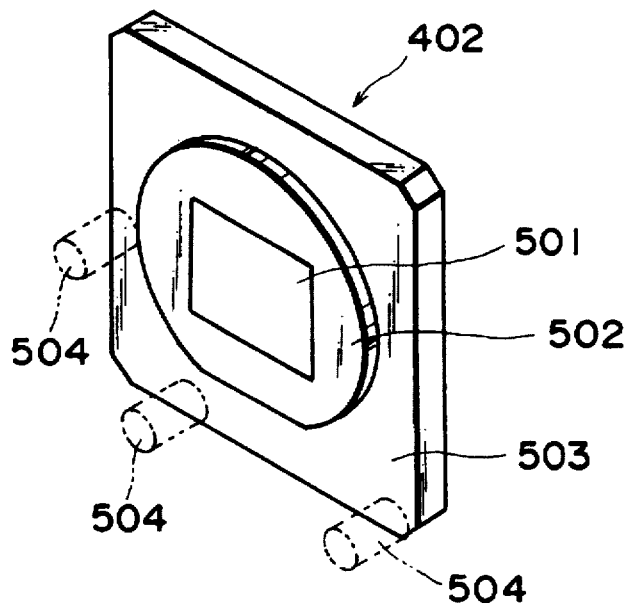

FIG. 27 is a schematic view for explaining an example of X-ray mask and the manner of holding the same.

Figure 28:
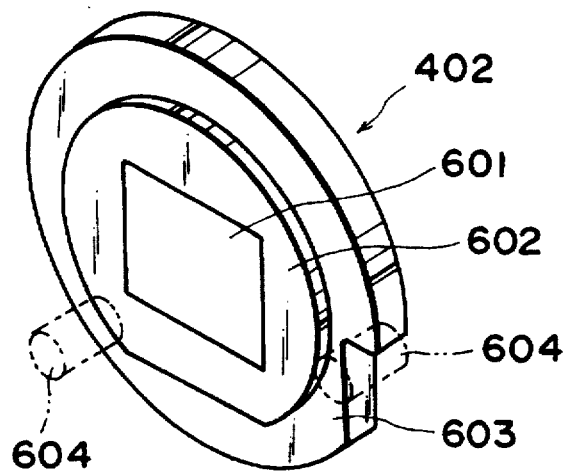

FIG. 28 is a schematic view for explaining another example of X-ray mask and the manner of holding the same.

4

DESCRIPTION OF THE PREFERRED EMBODIMENTS

[First Embodiment]

Figure 1:
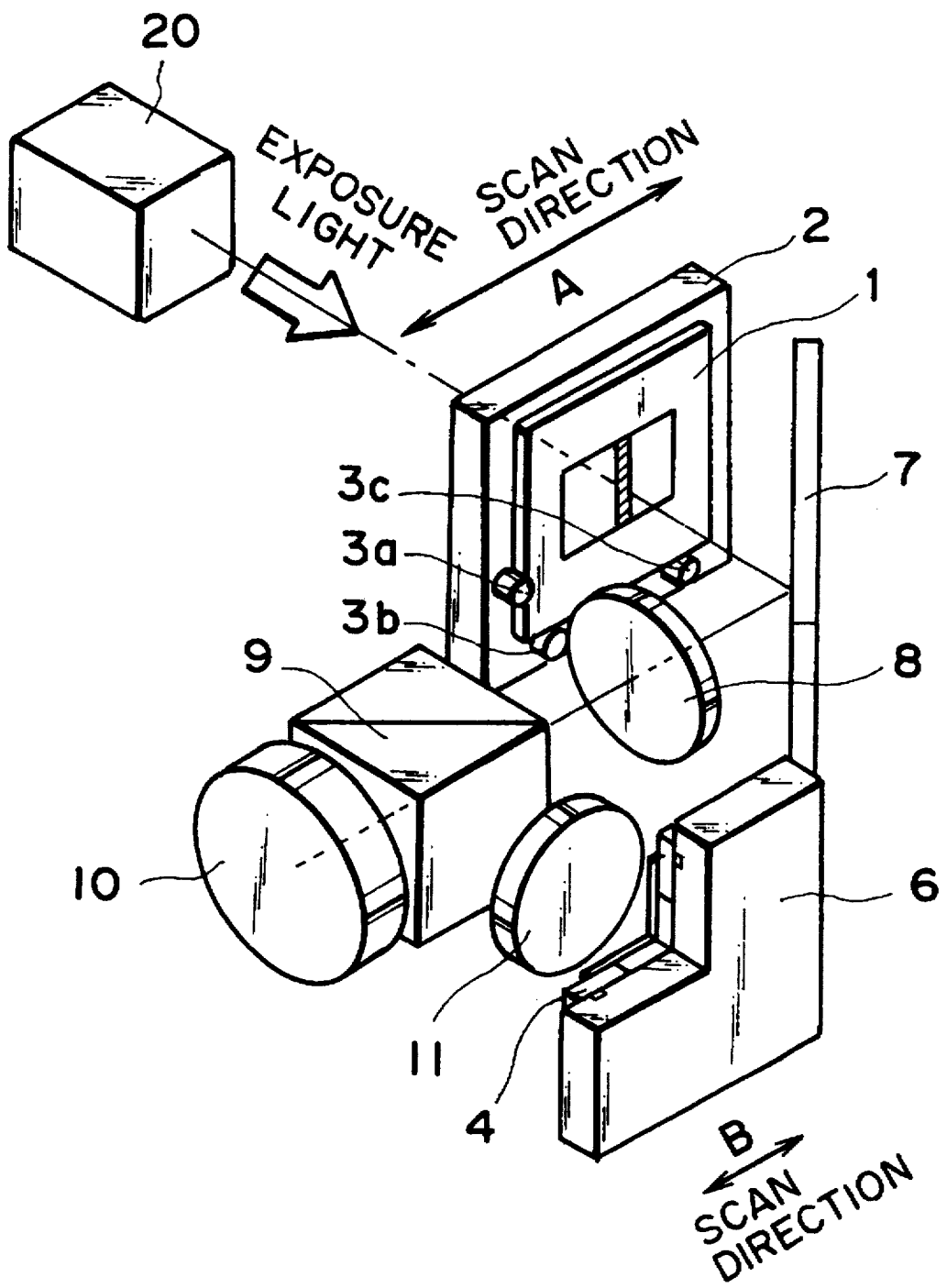
FIG. 1 is a perspective view of a mask manufacturing apparatus according to a first embodiment of the present invention.

FIG. 1 shows the features of a first embodiment of the present invention, and it illustrates an X-ray mask manufacturing apparatus comprising a mirror scan type reduction projection exposure apparatus. The drawing illustrates the general arrangement of an optical system which uses a reduction mirror optical system having small chromatic aberration to ensure a large area of exposure field through scanning exposure.

In FIG. 1, a master reticle (original) 1 has a transfer pattern having been formed by using an electron beam (EB) exposure apparatus, for example, and having a linewidth precision of N times of the minimum pattern size (N=4 in this embodiment). The master reticle 1 is attracted to and held by a reticle chuck of a reticle stage 2 in a vertical position, while being engaged by positioning pins 3a, 3b and 3c on the reticle stage 2. The reticle stage 2 having this reticle chuck comprises a single-axis stage, being movable in the direction of an arrow A.

On the other hand, a mask substrate (X-ray mask substrate) 4 is attracted to and held by a working mask chuck in a vertical position while being engaged by positioning pins, in a similar manner as the master reticle 1. A working mask stage 6 having this working mask chuck also comprises a single-axis stage, being movable in the same direction (arrow B) as the reticle stage 2. This working mask stage 6 is arranged so that it moves in the same direction as the direction of movement of an image of the master reticle 1 as formed by an optical system. It has a θ direction tilt movable mechanism having a large stroke in the scan direction and a small stroke in a direction perpendicular to the scan direction. The mask substrate 4 is going to be processed into an X-ray mask to be used in an X-ray exposure apparatus for the manufacture of semiconductor chips.

An illumination optical system 20 including a deep ultraviolet light source and a lens, for example, is provided for illumination of the master reticle 1 with slit-like exposure light. Also, a cata-dioptric system is disposed between the working mask stage 6 and the reticle stage 2. It comprises a deflecting mirror 7 for deflecting, by 90 deg., slit exposure light passed through the master reticle 1, a lens group 8 disposed downstream of the deflecting mirror, a beam splitter 9 and a concave reflection mirror 10, all being disposed in this order. Further, a lens group 11 is disposed between the beam splitter 9 and the working mask stage 6.

In the mask manufacturing apparatus of the described structure, the reticle stage 2 and the working mask stage 6 are scanningly exposed through the cata-dioptric system of a reduction ratio of 4:1, at a speed ratio of 4:1, and a precise circuit pattern is transferred to the mask substrate 4.

In this embodiment, the mounting position (attitude) during X-ray mask manufacture is kept vertical and, additionally, a positioning method the same as the positioning method to be adopted in an X-ray exposure apparatus is employed for positioning the X-ray mask. This assures the same condition for the loads to be applied to the X-ray mask at the time of X-ray mask manufacture and at the time of use of the same (i.e. the exposure process) (see FIG. 6). Therefore, a high precision mask manufacture as well as high reproducibility lithography with unchanged distortion by weight are realized.

[Second Embodiment]

FIG. 2 shows a second embodiment of the present invention, and it illustrates an X-ray mask manufacturing apparatus based on a reduction projection type scanning optical exposure apparatus. The drawing illustrates the general arrangement of an optical system which uses a reduction projection optical system with a slit image exposure region of small image distortion, to assure a large area of exposure field. A description of the elements corresponding to those of the embodiment of FIG. 1 will be omitted here.

A reduction projection lens 12 which is an optical system having a high N.A., is disposed between a master reticle 1 and a mask substrate 4. The mask substrate 4 is attracted to and held by a working mask stage 6 while being engaged by three positioning pins 3a, 3b and 3c on the working mask stage. The working mask stage 6 comprises a single-axis stage, being scanningly movable in the same direction as the reticle stage 2. Also, it has a mechanism by which the stage as a whole can be rotationally moved by 90 deg., as depicted by an arrow C, through cooperation of an indexer 13. Denoted at 14 is a hand for conveying the mask substrate 4 and for positioning the same with respect to the working mask stage 6.

In the arrangement described above, the mask substrate 4 being kept in vertical position is transferred by the hand 14 to the working mask stage 6 as depicted by dash-and-dots lines. Since the mask substrate 4 is then attracted and held in this state, any distortion of the mask substrate in the vertical direction due to the weight thereof is maintained even when it is rotated by 90 deg. in the exposure apparatus after the transfer thereof and held horizontally. After the positioning of the master reticle 1, as in the first embodiment, the reticle stage 2 and the working mask stage 6 are scanningly exposed while the moving speeds of them are controlled in accordance with the ratio of reduction by the reduction projection lens 12, whereby a precise circuit pattern is transferred and printed on the mask substrate 4.

In the scan exposure patterning of this embodiment, while the mounting position of the working mask (to be processed into an X-ray mask) is vertical, it is positioned substantially in vertical position and attracted and held in this state. As a result, like the first embodiment, the same condition is assured with respect to the loads to be applied to the X-ray mask at the time of manufacture of the same and at the time of use of the same (exposure process of FIG. 6).

[Third Embodiment]

FIG. 3 illustrates an X-ray mask manufacturing apparatus based on a reduction projection type scanning optical exposure apparatus, according to a third embodiment of the present invention. The slit image exposure to be done in this embodiment is the same as has been described with reference to the second embodiment. Also, a description of the elements corresponding to those of FIGS. 1 and 2 will be omitted here.

As shown in FIG. 3, a mask substrate 4 is a circular mask similar to that shown in FIG. 8. This mask substrate 4 is attracted to and held by a working mask stage 6 while being engaged by two positioning pins 3 (only one of them is shown) on the working mask stage 6. In this embodiment, the mounting position of the mask substrate 4 in the exposure apparatus is horizontal, and the transfer of the same to the exposure station is made also in the horizontal state. This embodiment has a feature that, as an alternative method for reproducing, in the horizontal position, the deformation of the X-ray mask caused by its weight when held in the vertical position, a mechanism is added to apply to the mask substrate 4 an external force corresponding to the weight thereof. More specifically, a pressing member 17 presses the outer periphery of a supporting frame of the mask substrate 4 at two points. This pressing member 17 is provided with two resilient hinges, and strain gauges 5a and 5b are adhered to these hinges, respectively. Outputs from these strain gauges 5a and 5b are compared with each other in a control circuit 15, and the control circuit 15 controls an air cylinder 16 to apply to the mask substrate 4 an external force corresponding to the weight thereof. The air cylinder may be replaced by an actuator having a voice coil motor.

While the present embodiment assures the manufacture of X-ray masks based on the transfer of a high precision circuit pattern, in a case where X-ray mask inspection is done by using an electron beam measurement apparatus, it is possible to perform the inspection while applying a corresponding external force in a similar way.

In the embodiments described above, a particular note has been made of the fact that an X-ray mask is chucked (mounted) substantially vertically in the X-ray exposure process, and regardless of whether, in the X-ray mask manufacturing process, the X-ray mask is chucked (mounted) vertically or horizontally, the same X-ray mask load condition as that during the X-ray exposure process is established. Thus, the manufacture of X-ray masks having high positional precision is ensured.

Further, the exposure process is done while scanning the master reticle stage and the working mask stage. This is effective to prevent a local temperature rise and, therefore, to avoid thermal distortion due to such a local temperature rise. As a result, a high precision circuit pattern can be transferred to a mask substrate (working mask), which leads to enhanced precision of the X-ray mask pattern.

Additionally, the use of a scanning exposure process effectively allows enhancement of resolution as well as enlargement of the area of exposure field. Thus, mass production and a stable supply of X-ray masks are made possible.

[Fourth Embodiment]

FIG. 4 is a sectional view of an X-ray manufacturing apparatus according to another embodiment of the present invention. FIG. 5 is a plan view schematically showing a reticle stage of FIG. 4, and FIG. 6 is a plan view schematically showing a mask substrate stage of FIG. 4.

The X-ray mask manufacturing apparatus of this embodiment adopts a scanning exposure method in which a portion of a pattern formed on a master reticle (original) is projected on a mask substrate at a reduced scale, and in which the reticle and the mask substrate are scanningly moved along the plane of projection in a timed relationship, whereby the whole pattern of the reticle is transferred to a predetermined region on the mask substrate.

As best seen in FIG. 4, the X-ray mask manufacturing apparatus comprises an illumination optical system 42 for illuminating a master reticle (original) 1 with deep ultraviolet light source DUV, a reduction projection optical system 41 for projecting a portion of the pattern of the master reticle 1 onto the mask substrate 4 at a predetermined reduction magnification, a reticle stage 2 which serves to hold the master reticle 1 and which serves as original scanning means for scanningly moving the master reticle 1, and a mask substrate stage 6 which serves to hold the mask substrate 4, onto which the pattern of the master reticle 1 it to be transferred, in parallel to the master reticle 1 and which serves as mask substrate scanning means for scanningly moving the mask substrate 4. These components are supported integrally by means of a frame 33.

In FIG. 4, the illumination optical system 42, including a light source and a lens, for example, for projecting deep ultraviolet light to the master reticle 1, is fixed by the frame 33 to the side of the reticle stage 2 on which the master reticle 1 is mounted. At a side of the master reticle 1 remote from the illumination optical system 42, there is the reduction projection optical system 41 for projecting a pattern of the master reticle 1 onto the mask substrate 4 at a predetermined reduction magnification, the projection optical system being fixed by the frame 33.

As best seen in FIG. 5, the reticle stage 2 comprises a reticle chuck 112 for carrying thereon and holding the master reticle (original) 1 having a pattern 111 to be transferred to the mask substrate (not shown), driving means 21 with guide means for moving the reticle chuck 112 in the scan direction (X direction), and measuring means for measuring the position of the reticle chuck in the scan direction as well as the position (attitude) thereof within the scan plane.

The driving means 21 may comprise a linear motor which can be driven by a driver, not shown. The guide means may comprise an air bearing having a plurality of air pads (not shown) fixed to the reticle chuck 112 and guide members 222 and 223 for supporting these air pads. The guide members 222 and 223 are held by the frame 33. The measuring means for measuring the position and attitude of the reticle may comprise a laser measuring device having measuring mirrors 231, 232 and 233 fixed to end faces of the reticle chuck 112. The measuring mirrors 231 and 232 may comprise corner cube mirrors disposed symmetrically with respect to the center of the illumination region 112. The measuring mirror 233 may comprise a flat mirror having high flatness, and it has a reflection surface of sufficient length with respect to the movable range of the stage. It is fixed in parallel to the movement direction of the reticle chuck 112 as determined by the guide means. Disposed opposed to the positions of the measuring mirrors 231, 232 and 233 are interferometers 241, 242 and 243, respectively, all being mounted on the frame 33. From a laser source, not shown, laser light is supplied to these mirrors and interferometers, by which the position of the reticle in the scan direction can be measured at the points of the mirrors 231 and 232. Also, by means of the measuring mirror 233, comprising a flat mirror, the position of the reticle with respect to the direction perpendicular to the scan direction can be measured. The position of the center of the reticle in the scan direction can be detected in accordance with an average of output signals of two interferometers 241 and 242, for measuring the position of the stage in the scan direction.

As best seen in FIG. 6, the mask substrate stage 5 for moving the mask substrate 4 of FIG. 4 along the plane of projection, comprises a mask substrate chuck 52 for carrying thereon a mask substrate 4 onto which a pattern of the master reticle 1 is to be transferred, and a fine motion driving mechanism 71 for minutely displacing the mask substrate chuck 52 in a rotational direction (θ direction) within the projection plane, in a direction (Y direction) perpendicular to the scan direction (X direction), in a direction of optical axis (Z direction) and in a direction (wx, wy) for causing tilt of the mask substrate surface with respect to the plane of projection. The mask substrate stage further comprises driving means 71 with guide means, for moving the fine motion mechanism 71 in the scan direction (X direction) and measuring means for measuring the position of the mask substrate chuck 52 in the scan direction as well as the position (attitude) of thereof within the scan plane. The surface of the mask substrate 4 is coated with a photosensitive material (resist), and the pattern of the reticle is going to be transferred to the transfer region 511 on the mask substrate 4.

The driving means 73 may comprise a linear motor which can be driven by a driver, not shown. The guide means may comprise an air bearing having a plurality of air pads (not shown) fixed to the fine motion mechanism 71 and guide members 731 and 732 for supporting these air pads. The guide members 731 and 732 are held by the frame 33. The measuring means for measuring the position and attitude of the mask substrate chuck 52 may comprise a laser measuring device having measuring mirrors 611, 612 and 613 fixed to end faces of the fine motion mechanism 71. The measuring mirrors 611 and 612 may comprise corner cube mirrors disposed symmetrically with respect to the center of the transfer region 511. The measuring mirror 613 may comprise a flat mirror having high flatness, and it has a reflection surface of sufficient length with respect to the movable range of the stage. It is fixed in parallel to the scan direction of the mask substrate 4. Disposed opposed to the positions of the measuring mirrors 611, 612 and 613 are interferometers 621, 622 and 623, respectively, all being mounted on the frame 33. From a laser source, not shown, laser light is supplied to these mirrors and interferometers, by which the position of the mask substrate 4 in the scan direction can be measured at the points of the mirrors 621 and 622. Also, by means of the measuring mirror 623, comprising a flat mirror, the position of the mask substrate with respect to the direction perpendicular to the scan direction can be measured.

Further, distance measuring sensors 631 and 632, for measuring the position of the mask substrate 4 surface with respect to the plane of projection, are fixed to the barrel of the reduction projection optical system 41 (FIG. 4). These sensors 631 and 632 are disposed at positions corresponding to the positions close to the opposite ends of the slit-like exposure region (not shown) to be projected by the reduction projection optical system upon the mask substrate 4 at a reduced scale. The measurement positions are not within the slit-like exposure region (not shown) but they are before the exposure region with respect to the scan direction. In this embodiment, the fine motion driving mechanism 71 is so controlled that, during the scan exposure process, the height (level) of the mask substrate 4 is measured beforehand at that measuring point and, at the moment at which the measuring point enters the exposure region, the mask substrate 4 is moved so that the position of it surface is brought into coincidence with the imaging plane.

In the embodiment of the described structure, the minimum pattern linewidth of the X-ray mask should desirably be equal to or less than 0.25 micron. With respect to the resolution requirement, a KrF excimer laser, for example, is used as an illumination light source, and the reduction optical system has a numerical aperture (N.A.) of 0.6 or more. As shown in FIG. 5, the illumination region 112 has a slit-like rectangular shape, having a smaller size in the scan direction (X direction) and a larger size in the direction (Y direction) perpendicular to the scan direction. A portion of the pattern 111 of the master reticle 1, corresponding to this illumination region 112, is projected to and imaged on the mask substrate 4 by the reduction projection optical system 41 at a reduced magnification of 0.25.

In the X-ray mask manufacturing apparatus of this embodiment, when a pattern of a reticle (original) is transferred to a mask substrate, the transfer magnification in the scan direction and the transfer magnification in the direction perpendicular to the scan direction can be made different from each other. The transfer magnification in the scan direction is determined by the speed ratio Nst between the scan speed of the mask substrate stage 6 and the scan speed of the reticle stage 2. The transfer magnification in the direction perpendicular to the scan direction is determined by the magnification Nop of the reduction projection optical system.

If, however, these two magnifications are made different from each other, since the moving speed of scan of the projected image of the reticle and the moving speed of scan of the mask substrate are different from each other, there results an image blur. The product of an effective illumination region size on the reticle in the scan direction and the magnification difference (=Nop−Nst) is the relative displacement which is the major factor of this image blur, wherein the effective illumination region size may be equivalent to the illumination region size in the scan direction if the illumination intensity distribution is even, namely, the size of the shorter or minor width of the slit-like illumination light in that case and, if the illumination intensity distribution is not even, the size may be equivalent to a value 2σ, for example, which represents the expansion of the distribution in the scan direction. The amount of such relative displacement should desirably be made sufficiently smaller than the size of pattern linewidth to be printed on the mask substrate 4. For example, in order to suppress this relative displacement not greater than 0.04 micron while taking into account the magnification difference up to 10 ppm, the substantial illumination region size on the master reticle in the scan direction should be not greater than 4 mm and, to this end, the illumination light source system should desirably be provided with an aperture at a plane optically conjugate with the reticle surface or, alternatively, 2σ of expansion of the illumination intensity distribution should desirably be not greater than 4 mm. In that case, the corresponding substantial illumination region size on the mask substrate 4 in the scan direction is not greater than 1 mm.

For the manufacture of an X-ray mask from a master reticle (original) with the X-ray mask manufacturing apparatus of the structure described above, the following transfer magnification correction is done in correspondence with the structure of an illumination optical system of an X-ray exposure apparatus arranged so that X-ray exposure is done while a substrate to be exposed is disposed in proximity to a mask pattern.

The enlarging rate of an X-ray exposure apparatus using synchrotron radiation light is determined by the degree of parallelism (divergence angle) of the illumination light impinging on an X-ray mask and by the distance between the mask and a wafer. In FIG. 7, the distance along the light path to the mask from the center of divergence of the illumination light in the horizontal direction is denoted by Lh, and the distance between the mask and the wafer is denoted by G. Then, the transfer magnification in the horizontal direction is given by 1+G/Lh. Similarly, the distance along the light path to the mask from the center of divergence of the illumination light in the vertical direction is denoted by Lv. Then, the transfer magnification in the vertical direction is given by 1+G/Lv. Here, if the illumination light being convergent, not divergent, is incident on the mask, the center of divergence is on the opposite side of the light source and, therefore, corresponding Lv or Lh has a negative value.

For the manufacture of an X-ray mask to be used in an X-ray exposure apparatus of such structure, the magnification Nop of the reduction optical system as well as the speed ratio Nst between the scan speed of the reticle stage and the scan speed of the mask substrate stage, may be set as follows.

If in use of an X-ray mask in an X-ray exposure apparatus the scan direction of the X-ray mask manufacturing apparatus should correspond to the horizontal direction in the X-ray exposure apparatus, the following relation should be satisfied:

$$Nop \cdot (1+G/Lv) = Nst \cdot (1+G/Lh)$$

More specifically, the parameters of magnification should be set as follows.

If the finally defined size on the substrate exposed is denoted by W and the size on the original reticle corresponding to W is denoted by R, then:

$$Nop = W/R \cdot (1+G/Lv)$$

$$Nst = W/R \cdot (1+G/Lh)$$

Also, if the scan speed of the reticle stage is denoted by Vr and the scan speed of the mask substrate stage is denoted by Vm, the stage scan speed may be set to satisfy:

$$Vm/Vr = Nst$$

Also, if in use of an X-ray mask in an X-ray exposure apparatus the scan direction of the mask manufacturing apparatus should correspond to the vertical direction in the X-ray exposure apparatus, the following relations should be satisfied:

$$Nop \cdot (1+G/Lh) = Nst \cdot (1+G/Lv)$$

$$Nop = W/R \cdot (1+G/Lh)$$

$$Nst = W/R \cdot (1+G/Lv)$$

In any of these cases, the reticle is produced by an exposure process with an electron beam exposure apparatus. With the method described above, it is possible to produce, by using the same size reticle, a plurality of X-ray masks which are suited respectively to X-ray exposure apparatuses with illumination systems of different structures.

If X-ray lithography is to be used in combination with a projection exposure apparatus using ultraviolet light or deep ultraviolet light (namely, what is called a mix-and-match exposure process), the projection magnification of the projection exposure apparatus may be set as follows:

$$N = W/R$$

By setting it to satisfy this equation, it is possible to meet the mix-and-match exposure with use of the same size reticle.

Also, it is possible to correct distortion such is caused during a wafer treatment process, with the magnification setting of the scan exposure in the X-ray mask manufacture. In that case, a correction value peculiar to the wafer treatment process may be added to the magnification in the aforementioned equation. In this case, by setting different correction values in different directions, it is possible to meet distortion having directivity.

In the present embodiment described above, the transfer magnification in the scan direction and the transfer magnification in the direction perpendicular to the scan direction are set separately. This allows the manufacture of a plurality of X-ray masks, from the same size reticle (original), which are suited respectively to X-ray exposure apparatuses with different illumination optical systems, and this can be done in a reduced time as compared with a case in which an electron beam patterning apparatus is used.

Also, in the mix-and-match exposure process in semiconductor device manufacturing processes, for example, wherein X-ray lithography is used in combination with an exposure apparatus with a reduction projection optical system using a ultraviolet light source or a deep ultraviolet light source, semiconductor chips can be manufactured by using reticle series of the same size.

[Fifth Embodiment]

Next, an embodiment which assures the manufacture of X-ray masks having a wider pattern, will be explained. In this embodiment, upon a mask substrate a plurality of patterns are connected to each other (called "stitching"), and the thus juxtaposed patterns are transferred to define a wide field.

Now, an example such as shown in FIG. 8 wherein a pattern A and a pattern B are to be connected to each other, will be explained. However, this substantially applies to a case where three patterns A–C are to be connected (FIG. 9) or a case where four patterns A–D are to be connected (FIG. 10).

FIGS. 11 and 12 illustrate the relationship between the function and the layout of patterns formed in a master reticle in a case where patterns A and B are to be exposed. FIG. 11 shows the area on the master reticle to be illuminated with light when the pattern A is to be printed, as well as various patterns provided there. The region denoted by A in the drawing is the IC circuit pattern area, and the region depicted by hatching is the area coated with a Cr film, for example, for blocking the exposure light. Although FIG. 11 shows the reticle as if the reticle has also a pattern B, actually the reticle is formed with the IC pattern (pattern A) and alignment patterns (to be described below) only.

As for the alignment patterns, there are patterns RAA101 and RAA102 for setting and aligning the reticle at a predetermined position with respect to the exposure apparatus; patterns MAA78, MAA80 and MAA87 for positioning and aligning the mask, as the same is accomplished as the X-ray mask, with respect to an X-ray exposure apparatus in the chip manufacture; patterns NXL77 and NXL 79 which are to be printed on a wafer beforehand for alignment of a next layer in the chip manufacture; and stitching alignment patterns SAA(x)73 and SAA(y)71 as well as SAA(x)83 and SAA(y)81, wherein (x) denotes the X direction and (y) denotes the Y direction. Further, the master reticle of FIG. 11 is provided with patterns OLA(x)74, OLA(y)72, OLA(x)84 and OLA(y)82 for detecting any connection alignment error, i.e., the amount of misalignment of the stitched and printed patterns A and B. The pattern layout of FIG. 11 has a feature that the patterns WAA, NXL, SAA and OLA are all formed in an area corresponding to a scribe line along which, after an X-ray mask is accomplished and is used as a mask, chips printed on a wafer with X-rays are cut and separated. The patterns MAA75 and MAA80 may desirably be formed separately from each other for enhanced alignment precision when used as an X-ray mask.

The area on the reticle to be illuminated with light during scan exposure is denoted by W×L, wherein W and L satisfy the following condition (the scan is done in the Y direction (W direction)). Since the patterns MAA87, SAA(y)71, OLA(y)72, SAA(x)83, OLA(x)84 and MAA80 should be exposed, W has to be a width which covers these patterns.

Also, L in the scan direction has to cover the patterns MAA75 and MAA80 for exposure thereof. Since the patterns RAA101 and RAA102 are those patterns for aligning the reticle 47 with respect to the exposure apparatus, they do not have to be exposed with the exposure light. The rough limitation to the exposure area of L×W described above can be given by an aperture or a slit provided at the illumination light source side of the reticle. Also, the limitation in regard to the L direction may be given by controlling the amount of reticle stage feeding. For example, if, as the exposure area of a final X-ray mask, an area of 40 mm×40 mm is necessary, W may well be about 25 mm while L may well be 45 mm–50 mm. Also, Δx may be small as about 1 mm or less, and Δy may be small as about 100 microns or less.

FIG. 12 shows reticle pattern layout for printing the pattern B. In the drawing, denoted at B is an IC circuit area of the pattern B, and denoted at RAA101 and RAA103 are reticle alignment patterns for positioning the reticle with respect to the scanning exposure apparatus. Denoted at WAA89 and WAA94 are patterns for aligning an accomplished X-ray mask with a wafer, and denoted at NXL88 and NXL93 are patterns to be printed on a wafer for alignment of a next layer thereof, as the mask patterns are printed on the wafer. Denoted at MAA92 is an alignment mark for aligning the mask, used as an X-ray mask, with respect to an X-ray exposure apparatus, and denoted at SAA(x)96, SAA(x)100, SAA(y)90 and SAA(y)96 are alignment patterns for juxtaposing the patterns A and B and for retaining accurate interrelation of them when they are printed. Denoted at OLB(x)99, OLB(x)95, OLB(y)97 and OLB(y)91 are detection marks for detecting the amount of error resulting from connection and exposure of the patterns A and B.

FIG. 13 shows pattern layout of an X-ray mask manufactured by using the reticle for the pattern A of FIG. 11 and the reticle for the pattern B of FIG. 12 and by stitching these patterns. Actually, while not shown in FIG. 13, for blocking X-rays, an absorbing material such as Au is provided outside of the position corresponding to a a scribe area on a wafer.

It is to be noted that the patterns A and B can be adjoined on the basis of the positional information about the stage and the feeding precision, without relying on the stitching alignment using alignment marks. In that case, the stitching alignment patterns SAA(x)72, SAA(x)96, SAA(y)71, SAA(y)90, SAA(x)83, SAA(x)100, SAA(y)81 and SAA(y)98 of FIGS. 11, 12 and 13 may be omitted.

The foregoing description relates to an example where no spacing is present between the patterns A and B such as shown in FIG. 8. Next, a case such as shown in FIG. 14 wherein a scribe line 150 is present between patterns A and B, will be explained. The scribe line 150 may be provided in such case where the patterns A and B are to be cut and separated as different chips.

In this case, stitching patterns SAA(x) and SAA(y) as well as overlay patterns OLA(x), OLA(y), OLB(x) and OLB(y) may be provided in the area corresponding to the scribe line 150. An example is illustrated in FIGS. 15 and 16. The reference characters RAA, MAA, SAA, OLA, OLB, WAA and NXL all assigned to the elements corresponding to those shown in FIGS. 11 and 12.

Overlay detecting marks OLA(x)162, OLA(x)164, OLA(y)163, OLA(y)165, OLB(x)176, OLB(x)178, OLB(y)175 and OLB(y)177 are disposed in the area corresponding to the scribe line 150. The functions of these patterns and the relation thereof with the alignment system are essentially the same as described hereinbefore. In the area corresponding to the scribe line 150, not only these overly detecting marks but also stitching patterns SAA(x) or SAA(y) may be defined. Namely, in the area corresponding to the scribe line 150, overlay detecting marks and stitching alignment patterns may be provided. Also, in the case where, in relation to the IC manufacturing process, the number of layers is relatively small, patterns WAA or NXL may be provided.

Referring to FIG. 17, a scanning exposure machine for manufacture of masks in accordance with this embodiment, will be explained. Denoted at 130 is an illumination light beam. Denoted at 111 and 112 are alignment detection systems for performing reticle alignment and stitching alignment, wherein the reticle alignment is to be done with respect to the apparatus side, namely, the alignment detection system. Denoted at 114 is a slit aperture. It may not be disposed just before a reticle 15 but may be disposed at the light source side, before or after the position optically conjugate with that slit. Denoted at 116 is a reticle stage, and denoted at 117 is a driving system for the reticle stage. Denoted at 118 is a reticle holder. Denoted t 119 is a mirror and denoted at 120 is a lens system. Denoted at 121 is a half mirror or a polarization beam splitter, and denoted at 122 is a mirror. Denoted at 123 is a lens system, and denoted at 127 is a mask substrate. Denoted at 128 is a tilt stage, and denoted at 129 is an X-Y stage. Denoted at 124 and 125 is a focus detection system for bringing the X-ray mask surface and the master reticle into correct focus with respect to the optical system, comprising the mirror 119 to the lens system 123. On the basis of the detected value of this detection system, if defocused, the tilt stage 128 operates to adjust the tilt of the mask substrate 127 in a plane perpendicular to or parallel to the scan direction (Y direction), whereby accurate focusing is performed. Denoted at 126 is control means for driving the tilt stage 128 in response to the output of the focus detecting system 125, for this purpose.

Illumination light of slit-like shape is projected to the reticle (longitudinal direction of the slit is laid along the X direction in the drawing), and the reticle 115 and the mask substrate 127 are scanned in accordance with the reduction magnification 1/N, at a ratio of N:1. The focus detection may well be done with respect to two points which are within the reticle effective area of slit aperture shape. As regards the focus detection system denoted at 124 and 125, the element 124 comprises a semiconductor laser or a light emitting diode (LED) which serves to project two beams to the mask substrate 127 which is to be exposed. The element 125 comprises a position sensor (PSD), for example, for detecting light reflected from the substrate 127, by which the focus detection is performed. In a moment, two point focus is necessary between the reticle 115 and the mask substrate 127. Therefore, with the motion of the scan stage 129, the tilt stage 128 adjust the tilt in a direction parallel to the X-Z plane by an amount corresponding to the surface roughness of the mask substrate so as to keep the focus constantly. Denoted at 132 is a distance measuring device for measuring the motion of the reticle stage, and denoted at 133 is a distance measuring device for measuring the X or Y motion of the mask substrate 127.

In the embodiment described above, a reduction scanning exposure machine is used in combination with the pattern stitching exposure process, by which high resolution (fine pattern) as well as wide field of an X-ray mask are assured with low cost.

[Sixth Embodiment]

Referring to FIG. 18, an embodiment of mask manufacturing apparatus having a specific arrangement for attaining higher precision in manufacture of X-ray masks, will be explained. This X-ray mask manufacturing apparatus has a feature that: a holding mechanism for holding an X-ray mask substrate of thin film structure wherein a silicone nitride (SIN) supporting film 309, an X-ray absorbing material 307 and a resist 308 are formed on a silicone (Si) supporting frame 310, is provided with a cooling mechanism. The general structure including a scanning optical system is essentially the same as the preceding embodiment, and a description thereof will be omitted here.

The X-ray mask holding mechanism of the X-ray mask manufacturing apparatus of this embodiment defines a clearance 306 at the bottom of the X-ray mask substrate. The mask holding mechanism comprises a mask chuck 313 for vacuum attracting the silicone supporting frame 310 of the X-ray mask substrate to fix the same, a temperature controlling block 314 provided on a stage 316 separately from the mask chuck 313, a laser distance measuring means 314 disposed at the opposite sides of the temperature controlling block 314, and a piezoelectric actuator 315 disposed between the temperature controlling block 314 and the stage 316. The mask chuck 313 is formed with a vacuum attraction groove 312 on its top surface and, through this vacuum attraction groove 312, the silicone supporting frame 310 is vacuum attracted whereby the X-ray mask substrate is held fixed. The gas in the clearance 306 may comprise helium (He) gas of a pressure of 150 (Torr). The temperature controlling block 314 is provided with a cooling water flow passageway 311 formed in the upper portion thereof. By flowing a liquid such as water, for example, of a desired temperature through this cooling water flow passageway 311, the temperature of the gas contained in the clearance 306 is kept within a predetermined temperature range. The laser distance measuring device 304 serves to measure the spacing between the bottom surface of the X-ray mask substrate and the top surface of the temperature controlling block 314, and it outputs the result of measurement to a spacing controlling device (not shown). The piezoelectric actuator 315 operates in response to a control signal produced by the unshown spacing controlling device, to maintain constant the spacing between the bottom surface of the X-ray mask substrate (X-ray exposure window region) and the top surface of the temperature controlling block 314.

As the slit exposure light passes the pattern of the master reticle and impinges on the X-ray mask substrate for exposure thereof, within this X-ray mask substrate the exposure light is thermally converted and heat is generated therewithin. The thus generated heat is conducted to the X-ray absorbing material 307, the silicone nitride supporting film 309, the helium gas contained in the spacing, and the temperature controlling block 314 having the cooling water flow passageway 311 therein, sequentially. Here, a liquid such as water of a desired temperature is flowing through the cooling water flow passageway 311. Thus, the heat generated in the X-ray mask substrate is cooled by means of the cooling water flow passageway 311, such that the temperature of the X-ray mask substrate can be held constantly within a predetermined temperature range.

Next, the relationship between the temperature of the X-ray mask substrate as described and the clearance 306, will be explained. When the temperature of a silicone nitride film of a size of 35 mm square and a thickness of 2 microns is changed by $\Delta T$, the maximum displacement d thereof can be given by the following equation:

$$d = \Delta T \times 9 \times 10^{-9} \ [m]$$

If therefore the tolerable maximum displacement d is 0.01 micron, the tolerance of temperature change $\Delta T$ to be caused by generated heat is ±1.1° C. Also, if the length of the clearance 306 is denoted by L, the heat conductivity of the gas contained in this clearance 306 is denoted by λ, and the heat flow flux to be absorbed by the X-ray mask substrate is denoted by Q, then the temperature change ΔT of the X-ray mask substrate is given by:

$$\Delta T = Q/\lambda \times L$$

If therefore a He gas is used as the gas to be contained in the clearance 306, since the heat conductivity λ is $15 \times 10^{-2}$ W/(m·K) and the heat flow flux Q is 1000 W/m², the length L of the spacing should be not greater than $1.7 \times 10^{-4}$. If air is used as the gas to be contained in the clearance 306, since the heat conductivity λ is $2.6 \times 10^{-2}$ W/(m·K), the length L of the clearance 306 should be not greater than $2.9 \times 10^{-5}$. However the length L of the clearance 306 is changeable with the heat conductivity and heat flow flux of the medium contained in the clearance 306.

Next, the operation of the piezoelectric actuators 315 for holding the magnitude of the clearance 306 constant, will be explained. Two laser distance measuring devices 305 are provided at positions opposed to the sides of the temperature controlling block 314, and each is so mounted that the top surface of the laser distance measuring device 305 is placed substantially coplanar with the top surface of the temperature controlling block 314. The piezoelectric actuators 315 are provided between the temperature controlling block 314 and the stage 316, and they are disposed at positions corresponding to the positions of the laser distance measuring devices, respectively. Each laser distance measuring device serves to measure the spacing between the top surface thereof and the bottom surface of the X-ray mask substrate (back-etched portion thereof), and it signals the result of measurement to a spacing magnitude controlling means (not shown). The spacing magnitude controlling means serves to discriminate whether the measured value is equal to a predetermined value and, if not equal to the predetermined, it operates to actuate the piezoelectric actuators 315 to cause displacement of the temperature controlling block 314 relative to the stage 316 to adjust the position of the top surface of the temperature controlling block 314 with respect to the bottom surface of the X-ray mask so that the measured values of both of the laser distance measuring devices 305 become equal to the predetermined.

As regards the temperature adjustment by the temperature controlling block 314, in place of flowing a liquid of a constant temperature, a cooling technique such as a Peltier device which is based on a phenomenon that a temperature difference is created by flowing a DC current between adhered different conductors, may be used.

In the present embodiment described above, the heat generated in an X-ray mask substrate during exposure thereof is dissipated so that the X-ray mask substrate can be held at a predetermined temperature range. As a result, unwanted thermal distortion of the X-ray mask can be prevented and, therefore, the pattern transfer precision can be enhanced.

[Seventh Embodiment]

Referring now to FIG. 19, a mask manufacturing apparatus according to another embodiment of the present invention specifically arranged to enhance the precision in X-ray mask manufacture, will be explained. This X-ray mask manufacturing apparatus has a feature that a holding mechanism for holding an X-ray mask substrate 353 is provided with a plane distortion controlling mechanism. Since the general structure of this embodiment including a scanning optical system is essentially the same as the preceding embodiment, a description thereof will be omitted here.

The plane distortion controlling mechanism comprises: a plane outside position detecting sensor 367 and a light projecting system 368 which are disposed above the X-ray mask substrate 353, for measuring the position of the mask substrate surface in the plane outside direction; a differential pressure sensor 365 for detecting a differential pressure between top and bottom surfaces of the thin film portion of the X-ray mask substrate 353, a plane outside distortion controlling means 369 to which the plane outside position detecting sensor 367 and the differential pressure sensor 365 are connected and which serves to calculate, from the data supplied by these sensors, a differential value for controlling and maintaining the displacement of the thin film portion of the X-ray mask substrate 353 within a predetermined range; and a pressure controlling means 370 connected to the plane outside distortion controlling means and for increasing/decreasing the pressure in a clearance 371 defined between the thin film portion of the X-ray mask substrate 353 and the protruded top surface of a substrate chuck 354. Details of these elements will be explained below.

The X-ray mask substrate 353 has a transfer film of thin film structure supported by a silicone supporting frame. Through vacuum attraction of the silicone supporting frame, formed at the bottom of the X-ray mask substrate 353, by the substrate chuck 354 of substantially protruded shape in section, the X-ray mask substrate is held fixed. This vacuum attraction is performed by evacuating the clearance between the substrate chuck 354 and the silicone supporting frame of the X-ray mask substrate 353 with use of a vacuum pump 355 connected to a vacuum attraction portion of the substrate chuck 354 through a piping 356. A clearance 371 is defined between the thin film portion of the X-ray mask substrate 353 and the protruded top surface of the substrate chuck 354, and a predetermined pressure is maintained in this clearance 371.

The differential pressure sensor 365 has one input end connected to the protruded top surface of the substrate chuck 354 through a piping 363, and another input end connected to the top ambience of the X-ray mask substrate 353. It also has an output end connected to the plane outside distortion controlling means 369. The differential pressure sensor serves to detect the pressure in the clearance 371 between the thin film portion of the X-ray mask substrate 353 and the protruded top surface of the substrate chuck 354 as well as the pressure at the top of the X-ray mask substrate 353. The differential pressure of the detected pressures is outputted to the plane outside distortion controlling means 369.

The plane outside position detecting sensor 367 and the light projecting system 368 are disposed above the thin film portion of the X-ray mask substrate 353. Output terminal of this plane outside position detecting sensor 367 is connected to the plane outside distortion controlling means 369. Light projected by the light projecting system 368 is reflected at plural predetermined detection points on the X-ray mask substrate 353, and the reflected rays are received by a light receiving system of the plane outside position detecting sensor 367. In response, the plane outside position detecting sensor 367 performs measurement of the amount of displacement from a certain reference, with respect to the plural points. Then, it calculates a standard deviation σ of this displacement. The thus calculated standard deviation σ of the displacement corresponds to the curvature or flexure of the X-ray mask substrate 353. This standard deviation σ is considered here as the displacement of the X-ray mask substrate, and it is signaled to the plane outside distortion controlling means 369.

The plane outside distortion controlling means 369 has an input terminal connected to the differential pressure sensor 365 and to the plane outside position detecting sensor 367, and it has an output terminal connected to the pressure controlling means 370. On the basis of the output data from the differential pressure sensor 365 and the plane outside position detecting sensor 367, it calculates a differential pressure value as minimizing σ to be outputted by the plane outside position detecting sensor 367. Then it supplies a corresponding control signal to the pressure controlling means 370. Here, the calculation of the differential pressure as minimizing σ to be outputted by the plane outside position detecting sensor 367, is performed in accordance with a least square method, for example.

The pressure controlling means 370 is connected to the plane outside distortion controlling means 369, and it serves to pressurize or de-pressurize the clearance 371 in accordance with a control signal from the plane outside distortion controlling means 369. Reducing the pressure in the clearance 371 may be accomplished by providing an accumulator 358 communicating with the center of the protruded top surface of the substrate chuck 354 through a piping 357 and by using a vacuum pump 362 communicating with this accumulator 358 through a piping 361. Increasing the pressure in the clearance 371 may be accomplished by supplying a gas from a gas supplying source 360 communicating through a restriction valve 359 and through a forked portion of the piping 361. The adjustment of pressurization and de-pressurization of the clearance 371 is performed by adjusting the restriction or resistance through a variable restriction valve 366, provided in a portion of the piping 361, by use of the pressure controlling means 370 connected to this variable restriction valve 366.

If the pressure controlling means 370 operates to pressurize the clearance 371 defined between the thin film portion of the X-ray mask substrate 353 and the protruded top surface of the substrate chuck 354, the differential pressure sensor 365 and the plane outside position detecting sensor 367 produce and apply the differential pressure value at the top and bottom surfaces of the thus pressurized X-ray mask substrate 353 as well as the standard deviation σ of the displacement thereof to the plane outside distortion controlling means 369. The plane outside distortion controlling means 369 operates to compare the outputted differential pressure and σ with the differential pressure and σ in the state before pressurized. If σ in pressurized state is larger than σ in the state before pressurized, and if in this case the differential pressure is larger than the differential pressure in the state before pressurized, the plane outside distortion controlling means 309 supplies a pressure reducing signal to the pressure controlling means 370 so as to reduce the differential pressure. If in that case the differential pressure is smaller than the differential pressure in the state before pressurized, it supplies a pressure decreasing signal to the pressure controlling means 370 so as to enlarge the differential pressure. To the contrary, if σ in the pressurized state is smaller than σ in the state before pressurized, and if in this case the differential pressure is larger than the differential pressure in the state before pressurized, the plane outside distortion controlling means 369 supplies a pressurizing signal to the pressure controlling means 370 to enlarge the differential pressure more. If in this case the differential pressure is smaller than the differential pressure in the state before pressurized, it supplies a pressurizing signal to the pressure controlling means 370 so as to reduce the differential pressure more.

The pressure controlling means 370 operates in response to a pressurizing or de-pressurizing signal from the plane outside distortion controlling means 369, to change the restriction at the variable restriction valve 366 to thereby pressurize or de-pressurize the clearance 371. As regards the adjustment of the restriction of the variable restriction valve 366, if the restriction in the piping 361 is opened, the de-pressurizing force of the vacuum pump 362 becomes higher than the pressurizing force of the gas supplying source 360, whereby the clearance 371 is de-pressurized. If the restriction in the piping 361 is closed, the de-pressurizing force of the vacuum pump 12 becomes lower than the pressurizing force of the gas supplying source 10, whereby the clearance 371 is pressurized. In response to the pressurization or de-pressurization of the clearance 371, the differential pressure sensor 365 and the plane outside position detecting sensor 367 produce and apply the differential pressure value and σ of the displacement again to the plane outside distortion controlling means 369, in the manner as described hereinbefore. This operation continues until the comparison value of σ becomes larger with the pressurization. With repetitions of the above-described operation, the differential pressure is controlled and brought into a predetermined range, minimizing σ of displacement. This range can be predetermined in accordance with the resolution of the pressuring and de-pressurizing function of the clearance 371, the differential pressure sensor 365 and the plane outside position detecting sensor 367.

As an example, an X-ray mask substrate 353 was prepared by forming a SiN film of a thickness 2 microns on a Si substrate of a thickness 2 mm and a diameter 3 inches, through a CVD method. The central portion of the Si substrate of a size of 35 mm square (corresponding to a portion to be formed into a widow region for exposure light) was back-etched so that only the SiN film remained. In that example, when the differential pressure was $2.4 \times 10^{-10}$ N/mm$^2$, the displacement of the X-ray mask substrate in the plane outside direction was 0.45 micron. When the differential pressure was $2.5 \times 10^{-10}$ N/mm$^2$, the displacement of the X-ray mask substrate 353 in the plane outside direction was 0.22 micron.

FIG. 20 is a contour chart for illustrating deformation of a member to be exposed, due to the weight of an absorbing material. In this chart, each contour line is defined by plotting the same displacement points, and only the first quadrant with respect to the origin taken at the center of the member to be exposed, is illustrated. As seen in the drawing, in this example, the central portion of the mask substrate is raised. The axis Z of coordinates represents the plane outside direction.

The chart shows deformations A through I. These have the following values in meters:

A=$2.20 \times 10^{-7}$

B=$2.00 \times 10^{-7}$

C=$1.50 \times 10^{-7}$

D=$1.20 \times 10^{-7}$

E=$1.00 \times 10^{-7}$

F=$7.5 \times 10^{-8}$

G=$5.0 \times 10^{-8}$

H=$2.5 \times 10^{-8}$

I=0

FIG. 21 is a graph for explaining the tolerable range of the differential pressure, wherein the axis of abscissa denotes the displacement and the axis of ordinates denotes the differential pressure. As seen in FIG. 21, by taking the tolerable range for the differential pressure as $2.44\times10^{-10}$N/mm$^2$ to $2.50\times10^{-10}$N/mm$^2$, a displacement of 0.23 micron (target value) is attainable and also a transfer precision of 0.15 micron is attainable.

[X-Ray Mask Manufacturing Processes]

Next, examples of the overall processes for the manufacture of X-ray mask structure, including a pattern exposure and transfer process such as described hereinbefore, will be explained.

FIG. 22 shows a first example of X-ray mask structure manufacturing processes. In portion (a) of FIG. 22, on the surface of a silicon wafer 51 (to be formed into a supporting frame) with its opposite surfaces having been polished, an X-ray transmission film 52 such as silicone nitride is formed through a chemical vapor deposition method, for example. Then, in portion (b) of FIG. 22, back-etching of silicone is made, from the back of the wafer, to a portion thereof in which a pattern is to be formed later. By this, a self-sustaining film of X-ray transmission film is formed. In portion (c) of FIG. 22, a Cr material 53 and an Au material 54 for providing electrodes for electroplating, are formed on the X-ray transmission film with continuous vapor deposition through an EB deposition apparatus, with a thickness of 5 nm and a thickness of 50 nm, respectively. In portion (d) of FIG. 22, a resist material 55 is applied, and a mask pattern is then transferred by exposure to this resist material in accordance with any one of the methods described with reference to the preceding embodiments. After this, in portion (e) of FIG. 22, a heavy metal such as Au 16 is deposited into the clearances of the resist pattern by electroplating, and the resist is removed. Subsequently, in portion (f) of FIG. 22, Au sputtering treatment and oxidizing and decoloring treatment with O$_2$RIE are done to the exposed electrode portion of the non-pattern portion, whereby an X-ray mask structure is accomplished. Finally, in portion (g) of FIG. 22, the resultant substrate is adhered to a reinforcing frame 57 of Pyrex glass, silicone carbide or titanium alloy, for example, by using an epoxy adhesive agent 58, for example. When the X-ray mask is to be held in an X-ray exposure apparatus by using a magnetic chuck, in portion (h) of FIG. 22, a magnetic material 59 may be adhered to the mask frame 57.

FIG. 23 shows a second example of X-ray mask manufacturing processes. In portion (a) of FIG. 23, on the surface of a silicon wafer 61 (to be formed into a supporting frame) with its opposite surfaces having been polished, an X-ray transmission film 62 such as silicone nitride is formed through a chemical vapor deposition method, for example. Then, in portion (b) of FIG. 23, back-etching of silicone is made, from the back of the wafer, to a portion thereof in which a pattern is to be formed later. By this, a self-sustaining film of X-ray transmission film is formed. In portion (c) of FIG. 23, an etching stopper film 63 and an X-ray absorbing material film 64 are are formed on the X-ray transmission film through sputtering method, respectively. After this, a resist 65 is applied thereto. In portion (d) of FIG. 23, a mask pattern is transferred by exposure to this resist material in accordance with any one of the methods described with reference to the preceding embodiments. After this, in portion (e) of FIG. 23, the X-ray absorbing material film is dry-etched by using the resist material as a masking means, whereby a pattern is formed thereon. Subsequently, in portion (f) of FIG. f23, the etching stopper layer 63, exposed, of the non-pattern portion is removed, whereby an X-ray mask structure is accomplished. Finally, in portion (g) of FIG. 23, the resultant substrate is adhered to a reinforcing frame 66 of Pyrex glass, silicone carbide or titanium alloy, for example, by using an epoxy adhesive agent 67, for example. When the X-ray mask is to be held in an X-ray exposure apparatus by using a magnetic chuck, in portion (h) of FIG. 23, a magnetic material 68 may be adhered to the mask frame 66.

[Embodiment of Device Manufacture]

Next, an embodiment of a microdevice manufacturing method which uses an X-ray mask as manufactured in accordance with any one of the processes described hereinbefore, will be explained. The microdevice referred to here may be a semiconductor chip, a liquid crystal device, a micromachine or a thin film magnetic head, for example. The embodiment to be explained below as the example relates to the manufacture of semiconductor devices such as ICs or LSIs.

FIG. 24 is a flow chart of the sequence of manufacturing a semiconductor device, and FIG. 25 is a flow chart of a wafer process in that sequence. For the manufacture of such semiconductor device, Step S101 is a design process for designing the circuit of a semiconductor device. Step S102 is a process for manufacturing an X-ray mask on the basis of the circuit pattern design. This is done in accordance with any one of the mask manufacturing methods described hereinbefore. Step S103 is a process for manufacturing a wafer by using a material such as silicon.

Step S104 is a wafer process which is called a pre-process wherein, by using the so prepared mask and wafer through Steps S102 and S103, circuits are practically formed on the wafer through lithography. Step S105 subsequent to this is an assembling step which is called a post-process wherein the wafer processed by Step S104 is formed into semiconductor chips. This step includes assembling (dicing and bonding) and packaging (chip sealing). Step S106 is an inspection step wherein an operability check, a durability check, and so on of the semiconductor devices produced by Step S105 are carried out. With these processes, semiconductor devices are finished and they are shipped (Step S107).

FIG. 25 is a flow chart showing the details of the wafer process. Step S201 is an oxidation process for oxidizing the surface of a wafer, having been prepared through Step S103. Step S202 is a CVD process for forming an insulating film on the wafer surface by CVD method. Step S203 is an electrode forming process for forming electrodes on the wafer, having an insulating film, by vapor deposition. Step S204 is an ion implanting process for implanting ions to the wafer. Step S205 is a resist process for applying a resist (photosensitive material) to the wafer. Step S206 is an exposure process for printing, by exposure, the circuit pattern of the X-ray mask on the wafer. Step S207 is a developing process for developing the exposed wafer. Step S208 is an etching process for removing portions other than the developed resist image. Step S209 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A mask manufacturing method for manufacturing an X-ray mask, comprising the steps of:

holding, with a first stage, a master reticle having a pattern;

holding, with a second stage, a mask substrate;

irradiating the pattern of the master reticle held by the first stage with an ultraviolet beam to project the pattern onto the mask substrate held by the second stage at a predetermined reduction magnification;

scanningly moving the first and second stages at a predetermined speed ratio, whereby the pattern of the master reticle is transferred to the mask substrate; and fabricating an X-ray mask by use of the mask substrate having the pattern transferred thereto.

2. A method according to claim 1, wherein the X-ray mask comprises a mask for unit-magnification pattern transfer.

3. A method according to claim 1, wherein said mask substrate holding step holds the mask substrate in the same load condition as that when an accomplished mask is to be used.

4. A method according to claim 3, wherein said mask substrate holding step holds the mask substrate vertically.

5. A method according to claim 1, wherein said irradiating step irradiates the pattern with a slit-like ultraviolet beam.

6. A method according to claim 1, wherein the speed ratio of the scanning speed in said scanningly moving step and the predetermined reduction magnification in said irradiating step are substantially equal to each other.

7. A method according to claim 6, further comprising the step of setting the predetermined speed ratio in accordance with a ratio of transfer magnifications in a longitudinal direction and in a transverse direction of an accomplished mask in use thereof.

8. A method according to claim 1, further comprising the step of using a plurality of master reticles and juxtaposing patterns of the master reticles upon the mask substrate through lithographic transfer in a predetermined positional relationship, whereby a single mask pattern is provided.

9. A method according to claim 8, wherein each master reticle is formed with a predetermined detection mark, and wherein said using step comprises the step of juxtaposing the patterns of the master reticles upon the mask substrate on the basis of detection of the detection mark.

10. A method according to claim 1, further comprising the steps of holding a mask substrate at a position close to a temperature controlling block, and supplying a heat conductor medium into a clearance between the mask substrate and the heat adjusting block.

11. A method according to claim 10, further comprising the steps of adjusting the size of the clearance between the mask substrate and the temperature controlling block.

12. A method according to claim 10, wherein said supplying step supplies a heat conductor medium comprising a helium gas.

13. A method according to claim 1, further comprising the step of detecting displacement of the mask substrate being held, in a plane outside direction.

14. A method according to claim 13, further comprising the step of correcting the displacement on the basis of the detection of the displacement.

15. An X-ray mask manufactured in accordance with a method which comprises the steps of:

holding, with a first stage, a master reticle having a pattern;

holding, with a second stage, a mask substrate;

irradiating the pattern of the master reticle held by the first stage with an ultraviolet beam to project the pattern onto the mask substrate held by the second stage at a predetermined reduction magnification;

scanningly moving the first and second stages at a predetermined speed ratio, whereby the pattern of the master reticle is transferred to the mask substrate; and fabricating an X-ray mask by use of the mask substrate having the pattern transferred thereto.

16. A mask manufacturing apparatus for manufacturing an X-ray mask, comprising:

a first stage for holding a master reticle having a pattern;

a second stage for holding a mask substrate;

a light source for irradiating the pattern of the master reticle held by the first stage with an ultraviolet beam;

an optical system for projecting the pattern of the master reticle onto the mask substrate held by the second stage at a predetermined reduction magnification; and control means for scanningly moving the first and second stages at a predetermined speed ratio, whereby the pattern of the master reticle is transferred to the mask substrate.

* * * * *

UNITED STATES PATENT AND TRADEMARK OFFICE
CERTIFICATE OF CORRECTION

PATENT NO. : 5,593,800
DATED : January 14, 1997
INVENTOR(S) : HIDEHIKO FUJIOKA, ET AL.

It is certified that error appears in the above-indentified patent and that said Letters Patent is hereby corrected as shown below:

IN THE DRAWINGS:

SHEET 14, FIGURE 20

"POSTION" should read --POSITION--.

COLUMN 1:

Line 55, "such" should read --such an--.

COLUMN 2:

Line 9, delete "between".
Line 23, "of" (both occurrences) should read --of the--.

COLUMN 3:

Line 54, "X-ray" should read --an X-ray--.
Line 56, "of" should read --of an--.
Line 64, "X-ray" should read --an X-ray--.
Line 67, "of" 1st. occ. should read --of an --.

UNITED STATES PATENT AND TRADEMARK OFFICE
CERTIFICATE OF CORRECTION

PATENT NO. : 5,593,800
DATED : January 14, 1997
INVENTOR(S) : HIDEHIKO FUJIOKA, ET AL.

It is certified that error appears in the above-indentified patent and that said Letters Patent is hereby corrected as shown below:

COLUMN 4:

Line 9, "having" should read --having a--.

COLUMN 6:

Line 65, "it" should read --is--.

COLUMN 8:

Line 2, delete "of".
    Line 4, delete "going".

COLUMN 10:

Line 54, "such is" should read --such as is--.

COLUMN 11:

Line 8, "a" (first occurrence) should read --an--.

UNITED STATES PATENT AND TRADEMARK OFFICE
CERTIFICATE OF CORRECTION

PATENT NO. : 5,593,800
DATED : January 14, 1997
INVENTOR(S) : HIDEHIKO FUJIOKA, ET AL.

It is certified that error appears in the above-indentified patent and that said Letters Patent is hereby corrected as shown below:

COLUMN 12:

Line 13, "be" should read --be as--.
Line 14, "be" should read --be as--.
Line 38, delete "a" (first occurrence).
Line 58, "NXL" should read --NXL are--.

COLUMN 13:

Line 1, "overly" should read --overlay--.
Line 19, "t" should read --at--.

COLUMN 15:

Line 44, "predetermined." should read --predetermined value.--.

UNITED STATES PATENT AND TRADEMARK OFFICE
CERTIFICATE OF CORRECTION

PATENT NO. : 5,593,800  Page 4 of 5
DATED : January 14, 1997
INVENTOR(S) : HIDEHIKO FUJIOKA, ET AL.

It is certified that error appears in the above-indentified patent and that said Letters Patent is hereby corrected as shown below:

COLUMN 16:

Line 54, "Output"" should read --The output--.

COLUMN 17:

Line 49, "pressurized." should read --pressurization.--; and "in" should read --in a--.
Line 50, "pressurized," should read --pressurization,--.
Line 52, "pressurized," should read --pressurization,--.
Line 57, "pressurized," should read --pressurization,--.
Line 60, "pressurized," should read --pressurization,--.
Line 62, "pressurized," should read --pressurization,--.
Line 67, "pressurized," should read --pressurization,--.

UNITED STATES PATENT AND TRADEMARK OFFICE
CERTIFICATE OF CORRECTION

PATENT NO. : 5,593,800
DATED : January 14, 1997
INVENTOR(S) : HIDEHIKO FUJIOKA, ET AL.

It is certified that error appears in the above-indentified patent and that said Letters Patent is hereby corrected as shown below:

COLUMN 18:

Line 27, "pressuring" should read --pressurizing--.
Line 35, "widow" should read --window--.

COLUMN 19:

Line 10, "of" should read --of an--.

Signed and Sealed this

Ninth Day of September, 1997

Attest:

BRUCE LEHMAN

Attesting Officer

Commissioner of Patents and Trademarks